(12) United States Patent
Gao

(10) Patent No.: US 7,830,373 B1
(45) Date of Patent: Nov. 9, 2010

(54) SYSTEM AND METHODS OF CIVIL ENGINEERING OBJECTS MODEL

(76) Inventor: Bo Gao, 7596 - 114 Street, Delta, British Columbia (CA) V4C 5H4

( * ) Notice: Subject to any disclaimer, the term of this patent is extended or adjusted under 35 U.S.C. 154(b) by 965 days.

(21) Appl. No.: 11/655,585

(22) Filed: Jan. 19, 2007

Related U.S. Application Data

(60) Provisional application No. 60/786,408, filed on Mar. 27, 2006, provisional application No. 60/761,953, filed on Jan. 25, 2006.

(51) Int. Cl.
G06T 15/00 (2006.01)
G06T 17/00 (2006.01)

(52) U.S. Cl. ........................... 345/419; 345/420

(58) Field of Classification Search ............... 345/420, 345/419; 700/98; 703/1
See application file for complete search history.

(56) References Cited

U.S. PATENT DOCUMENTS

| | | | |
|---|---|---|---|
| 5,561,749 A | | 10/1996 | Schroeder |
| 5,615,319 A | | 3/1997 | Metzger et al. |
| 5,627,949 A | | 5/1997 | Letcher, Jr. |
| 6,480,190 B1 | | 11/2002 | Pfister |
| 6,639,592 B1 | | 10/2003 | Dayanand |
| 6,804,683 B1 * | | 10/2004 | Matsuzaki et al. ............... 1/1 |
| 6,958,752 B2 * | | 10/2005 | Jennings et al. ............ 345/420 |
| 6,982,710 B2 * | | 1/2006 | Salomie .................... 345/420 |
| 7,275,023 B2 * | | 9/2007 | Chen et al. .................. 703/2 |
| 7,280,990 B2 * | | 10/2007 | Turner et al. ................. 706/45 |
| 2001/0043236 A1 * | | 11/2001 | Yamamoto .................. 345/781 |
| 2001/0047251 A1 * | | 11/2001 | Kemp ........................... 703/1 |

OTHER PUBLICATIONS

Chen, W.F., Liew, J.Y. 2002. "The Civil Engineering Handbook", CRC Press, Florida, USA.

* cited by examiner

*Primary Examiner*—Kee M Tung
*Assistant Examiner*—Jacinta Crawford

(57) ABSTRACT

The invention relates to a computer implemented civil engineering objects system and methods for defining and representing three-dimensional civil engineering design components. The types of civil engineering objects comprise spot object, linear object and surface object. Each type of civil engineering objects are further classified as various categories based on their geometric and engineering similarities. Each civil engineering object comprises positioning geometry data for defining its spatial positioning in a Cartesian coordinates system, relative parametric perimeters data for defining its three-dimensional outline geometry relating to its positioning geometry, and relative parametric model means for calculating its spatial coordinates and geometric features from its positioning geometry data and relative parametric perimeters data according to its predefined relative parametric model. The relative parametric models are established per each civil engineering object category, and are predefined for all civil engineering object categories. The relative parametric model of a surface object comprises a ruled surface and relative parametric sections along its mesh lines.

17 Claims, 26 Drawing Sheets

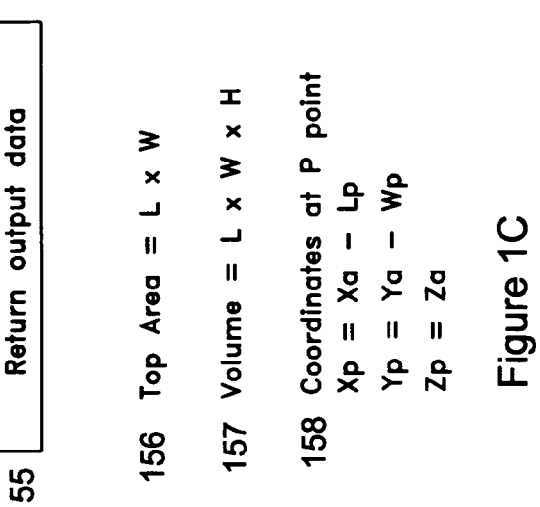
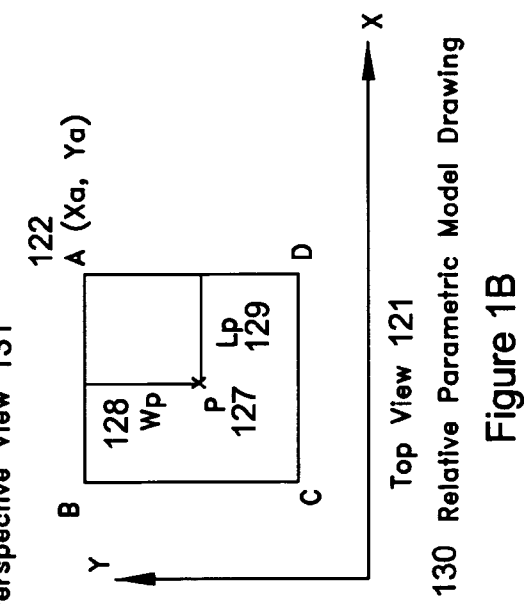
Figure 1C
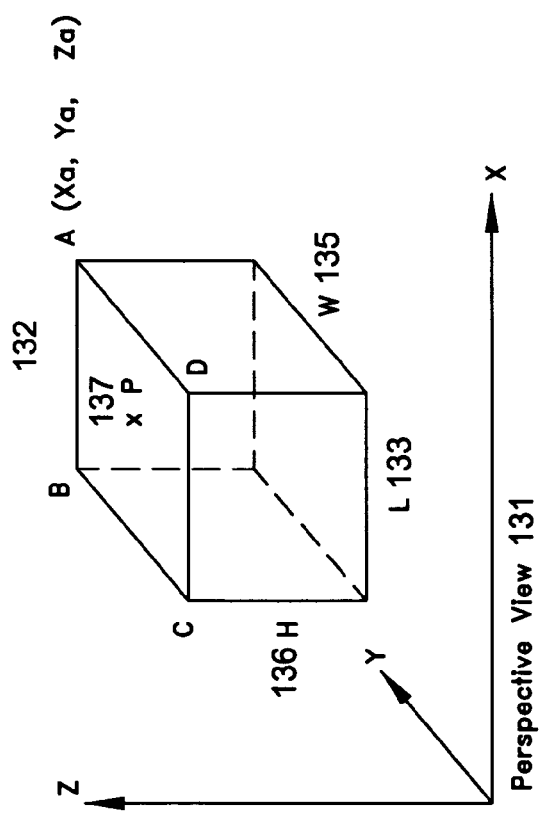
Figure 1B

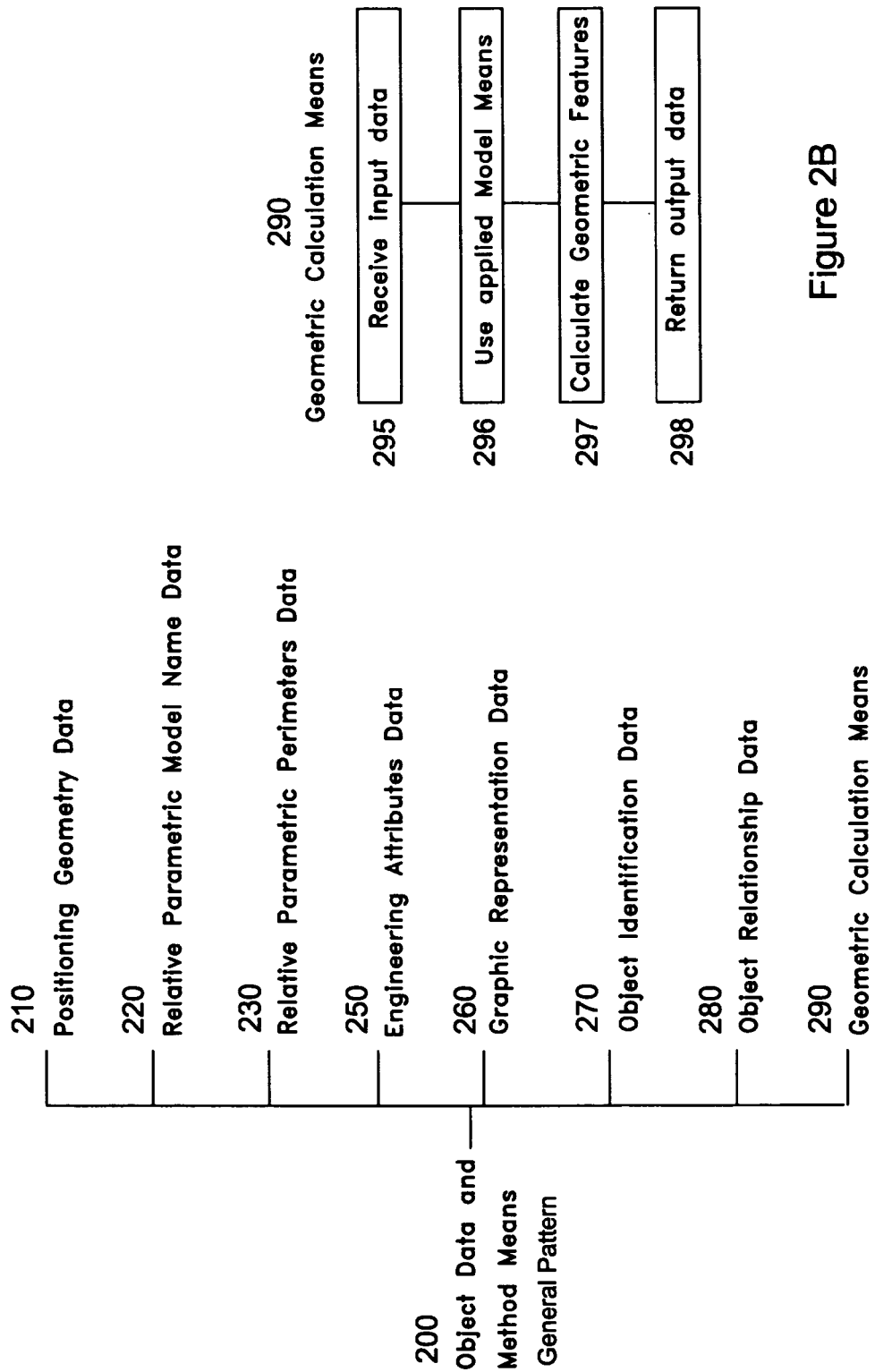

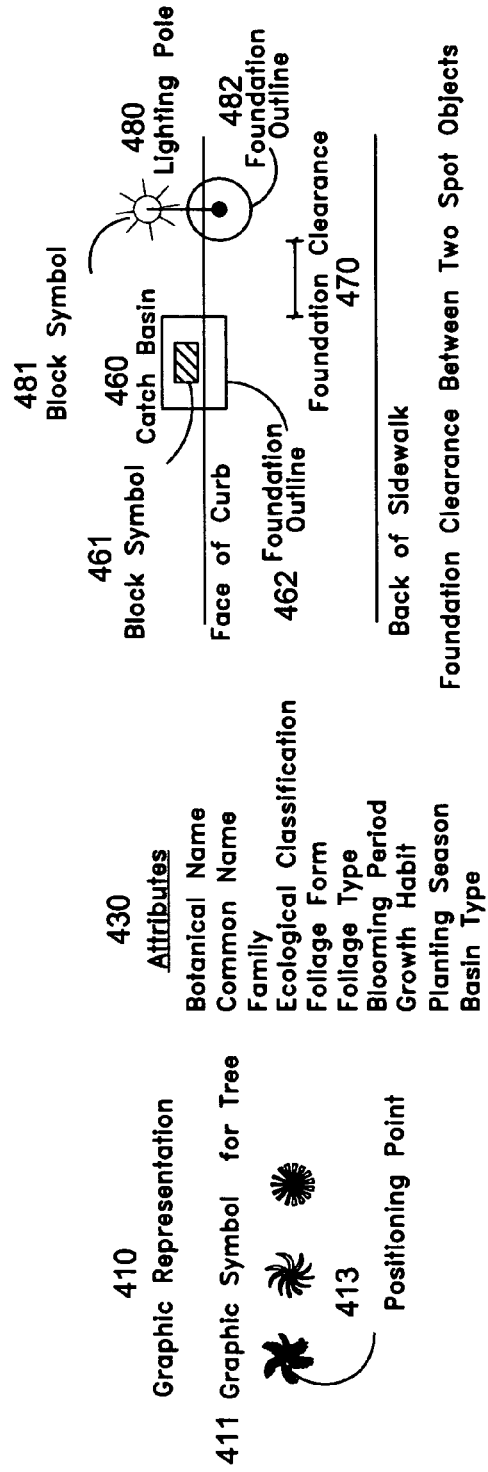
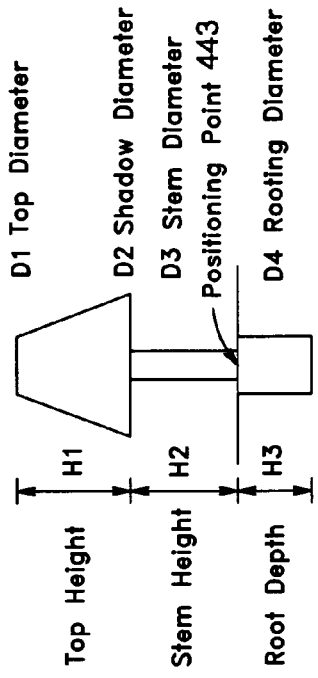
Figure 4A
Figure 4B

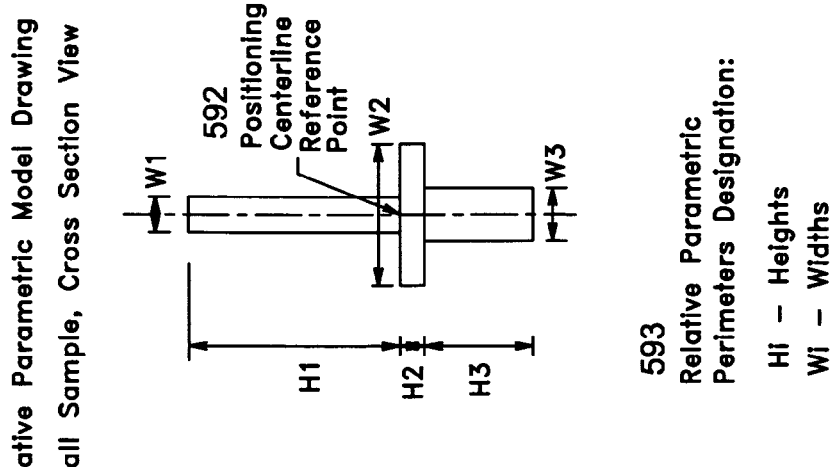

591
Relative Parametric Model Drawing
Wall Sample, Cross Section View

592
Positioning Centerline Reference Point

593
Relative Parametric Perimeters Designation:

Hi – Heights
Wi – Widths

Figure 5B

510 Positioning Geometry Data
Geometric definition data of a 3D alignment

520 Relative Parametric Model Name Data
A string value

530 Relative Parametric Perimeters Data
A collection of numerical values

550 Engineering Attributes Data
A collection of string values

560 Graphic Representation Data
A collection of string and numerical values

570 Object Identification Data
A string value or a numerical value

580 Object Relationship Data
A collection of string and numerical values

590 Geometric Calculation Means
Pre-programmed object methods

500
Object Data and Method Means for Linear Object

Figure 5A

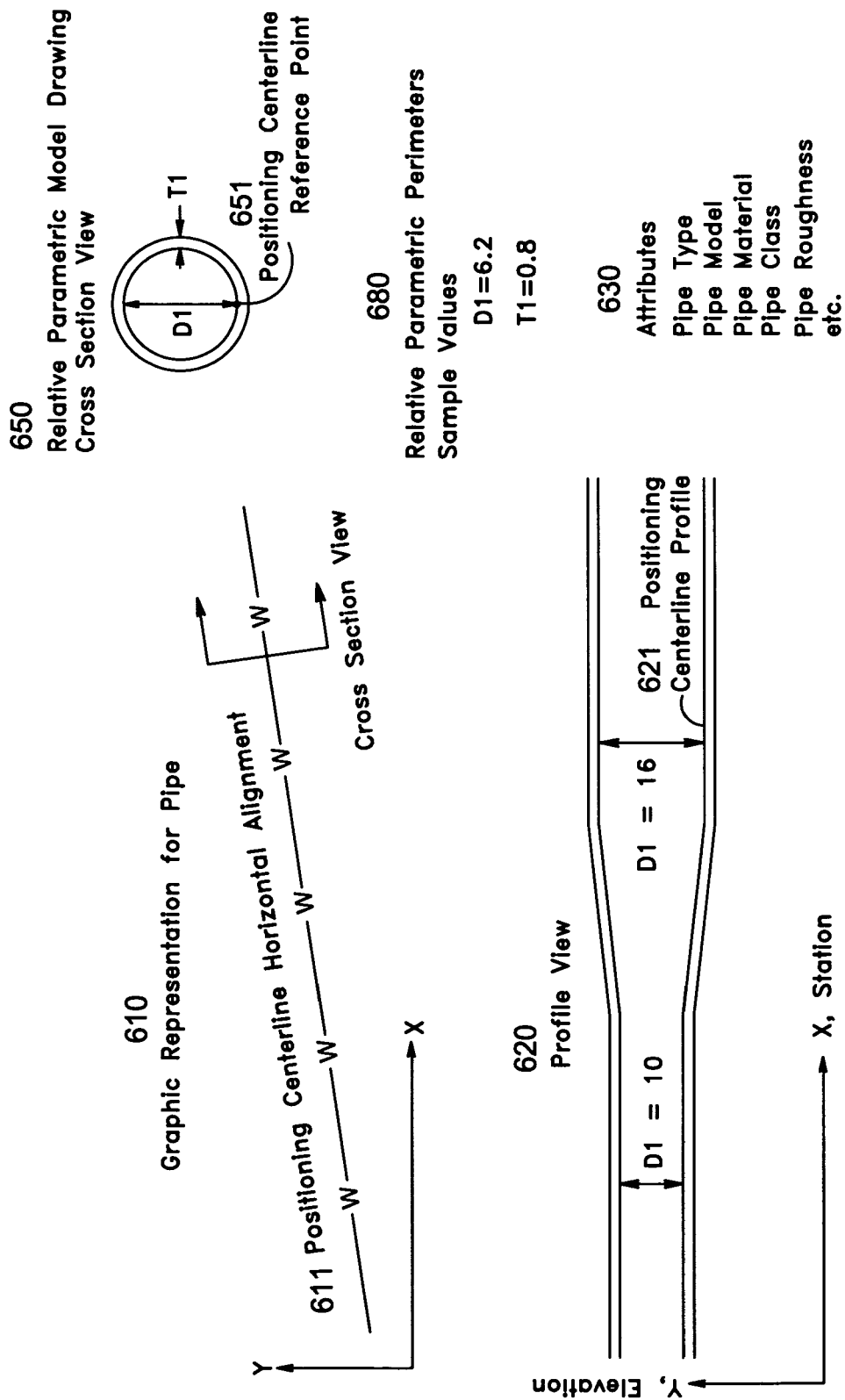
Figure 6A — Linear Object Sample - Pipe

Figure 7B — 721 Curb Sample Relative Parametric Model Drawing

- 722 mesh lines, Plane View
- 723 Primary 3D Edge
- 724 Secondary 3D Edge
- 725 Mesh Line
- Section View 726 Relative Parametric Section Drawing
- 727 Primary 3D Edge Reference Point
- 728 Secondary 3D Edge Reference Point
- Labels: S1, H1, H2, L2, H3, L1

729 Relative Parametric Perimeters Designation:
- Hi – Heights
- Wi – Widths
- Si – Slopes

Figure 7A

700 Object Data and Method Means for Surface Object

- 710 Positioning Geometry Data — Geometric definition data of two 3D alignment
- 711 Relative Parametric Model Name Data — A string value
- 712 Relative Parametric Perimeters Data — A collection of numerical values
- 713 Engineering Attributes Data — A collection of string values
- 715 Graphic Representation Data — A collection of string and numerical values
- 716 Object Identification Data — A string value or a numerical value
- 717 Object Relationship Data — A collection of string and numerical values
- 718 Geometric Calculation Means — Pre-programmed object methods
- 719 Mesh Line Generation Means — Pre-programmed object methods

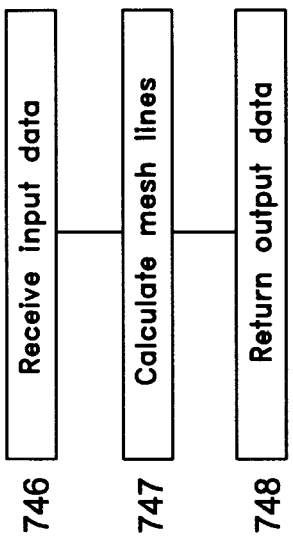
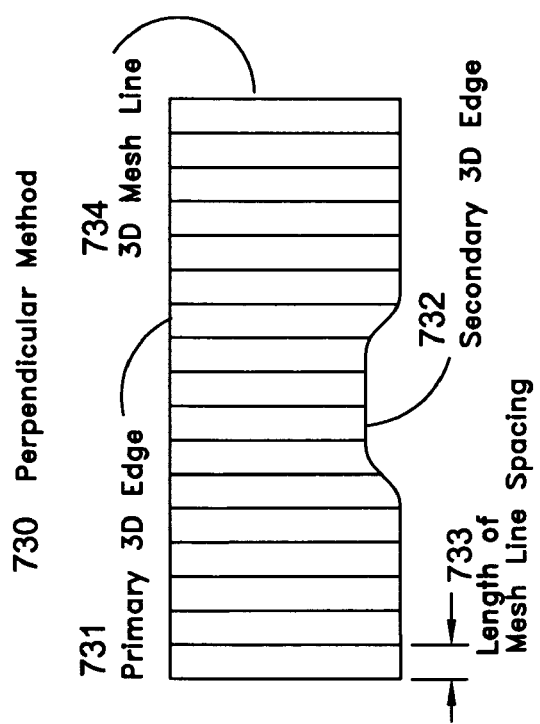
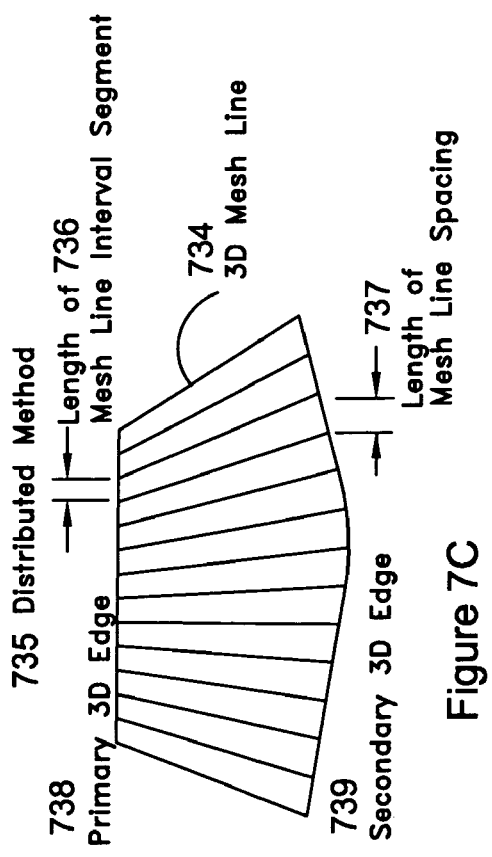
Figure 7D
Figure 7C

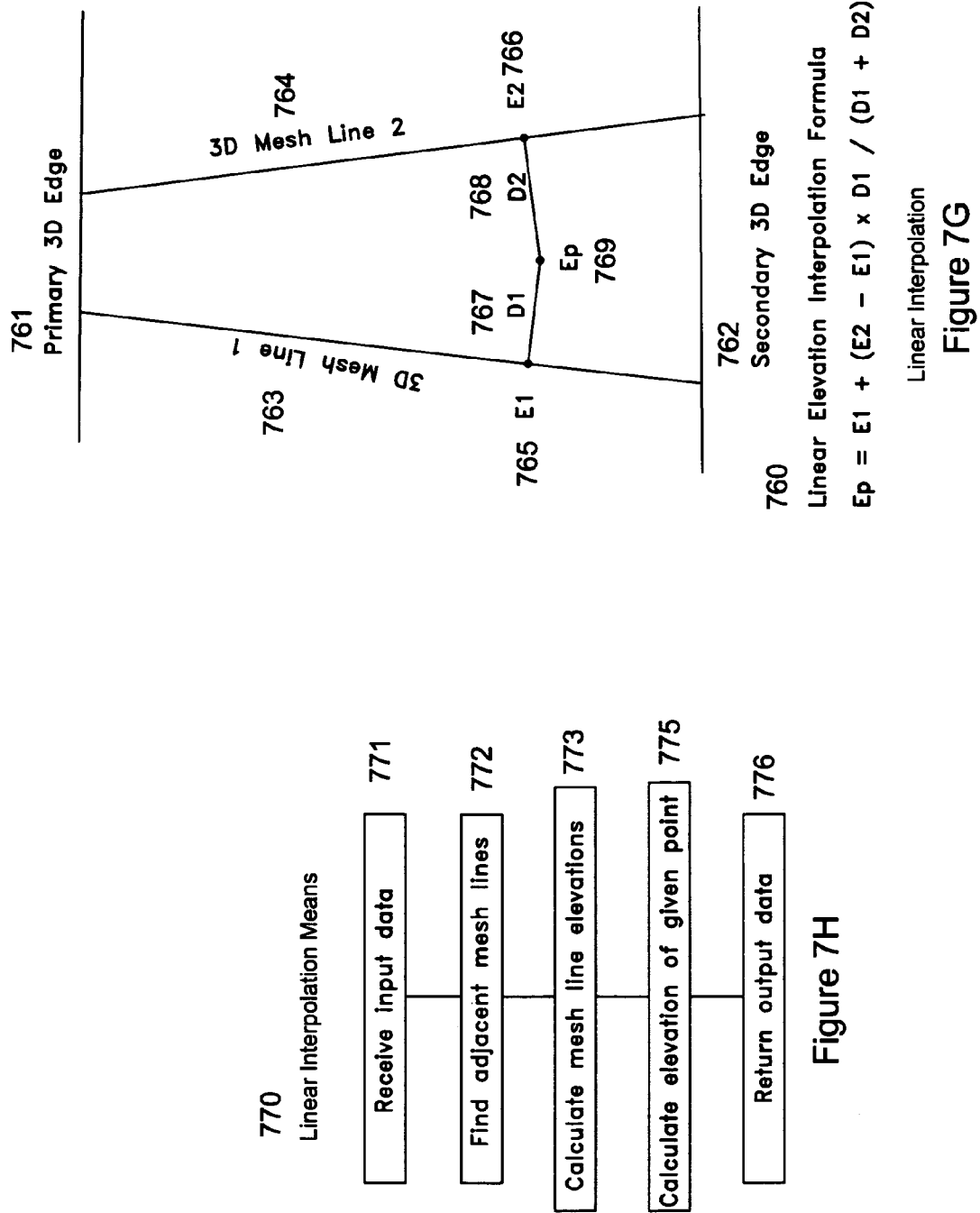

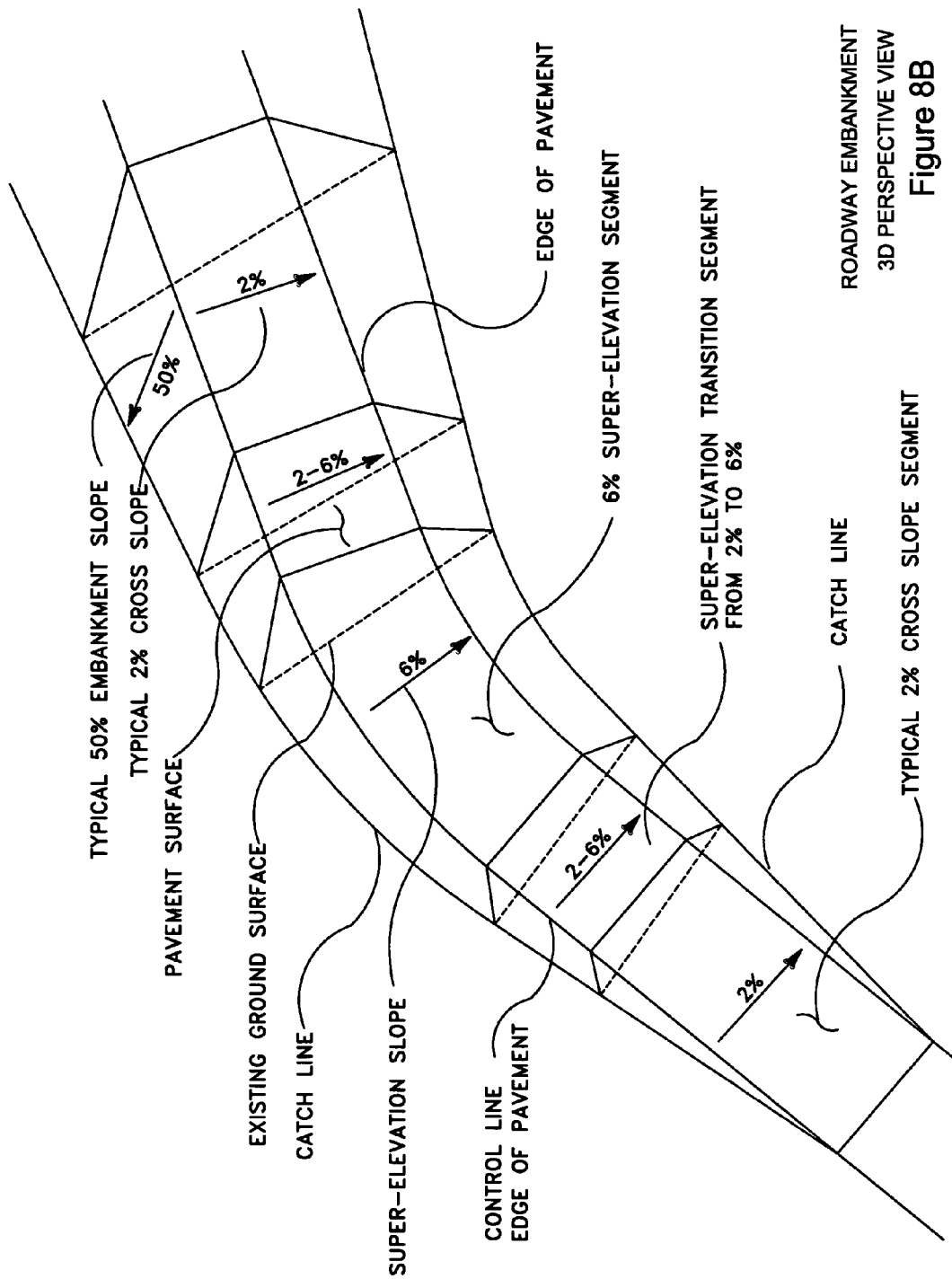

PLANE LAYOUT DRAWING
(THE PROJECTION ON THE EARTH PLANE)

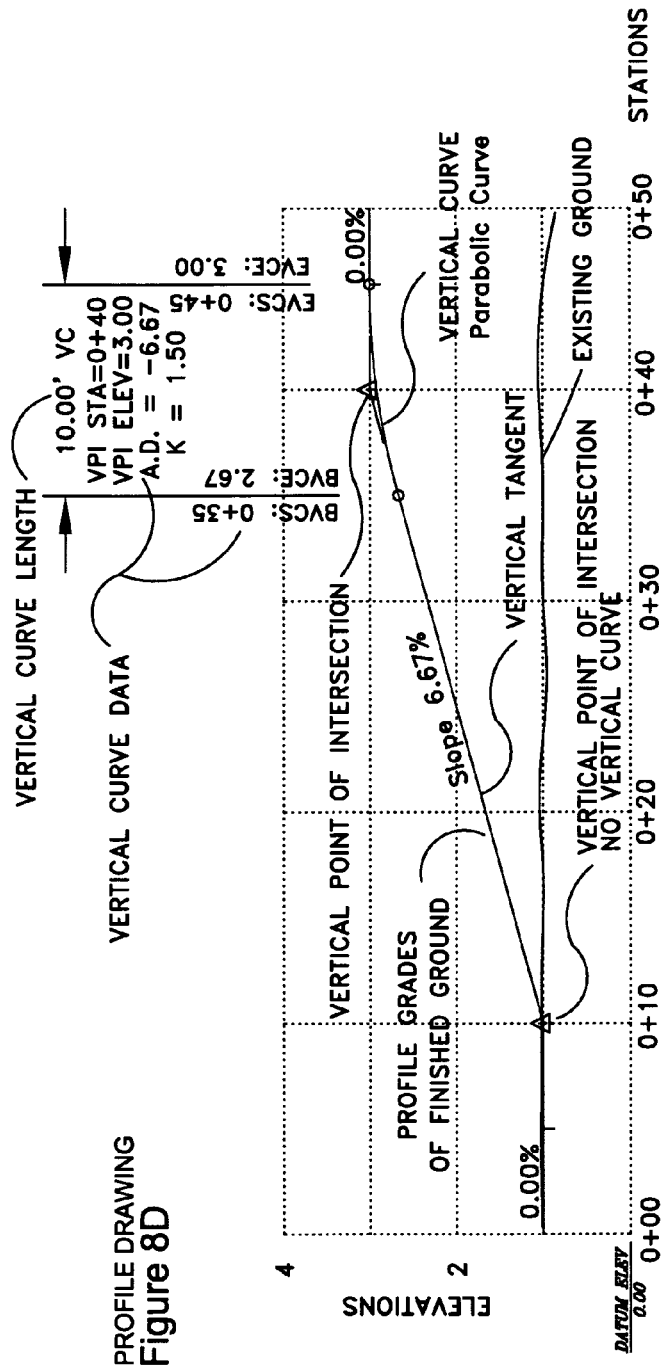

CROSS SECTIONS

3D Alignment in Rectangular Three-Dimensional Cartesian Coordinates System Perspective View

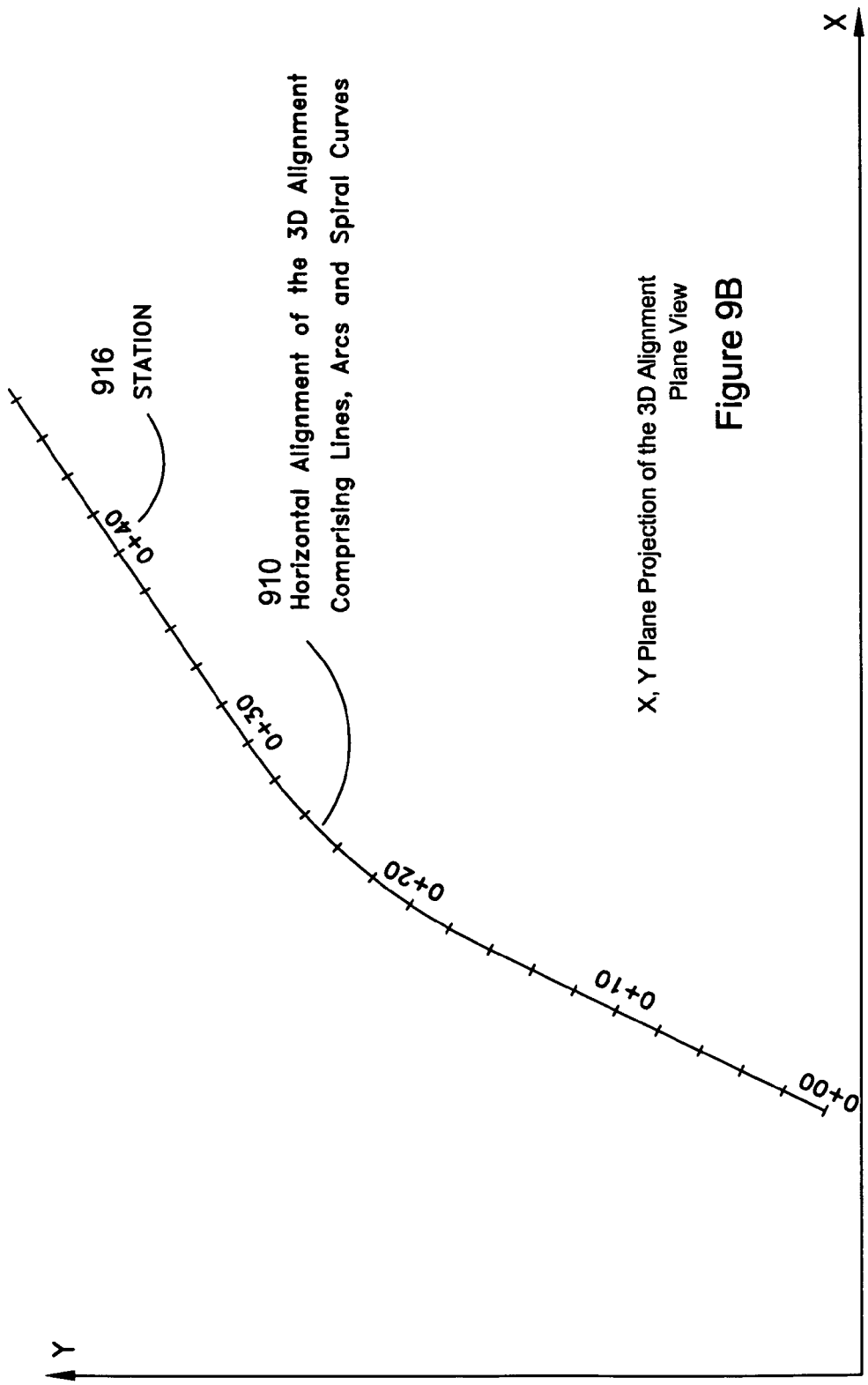

920 Profile of 3D Alignment, Vertical Section Along Horizontal Alignment

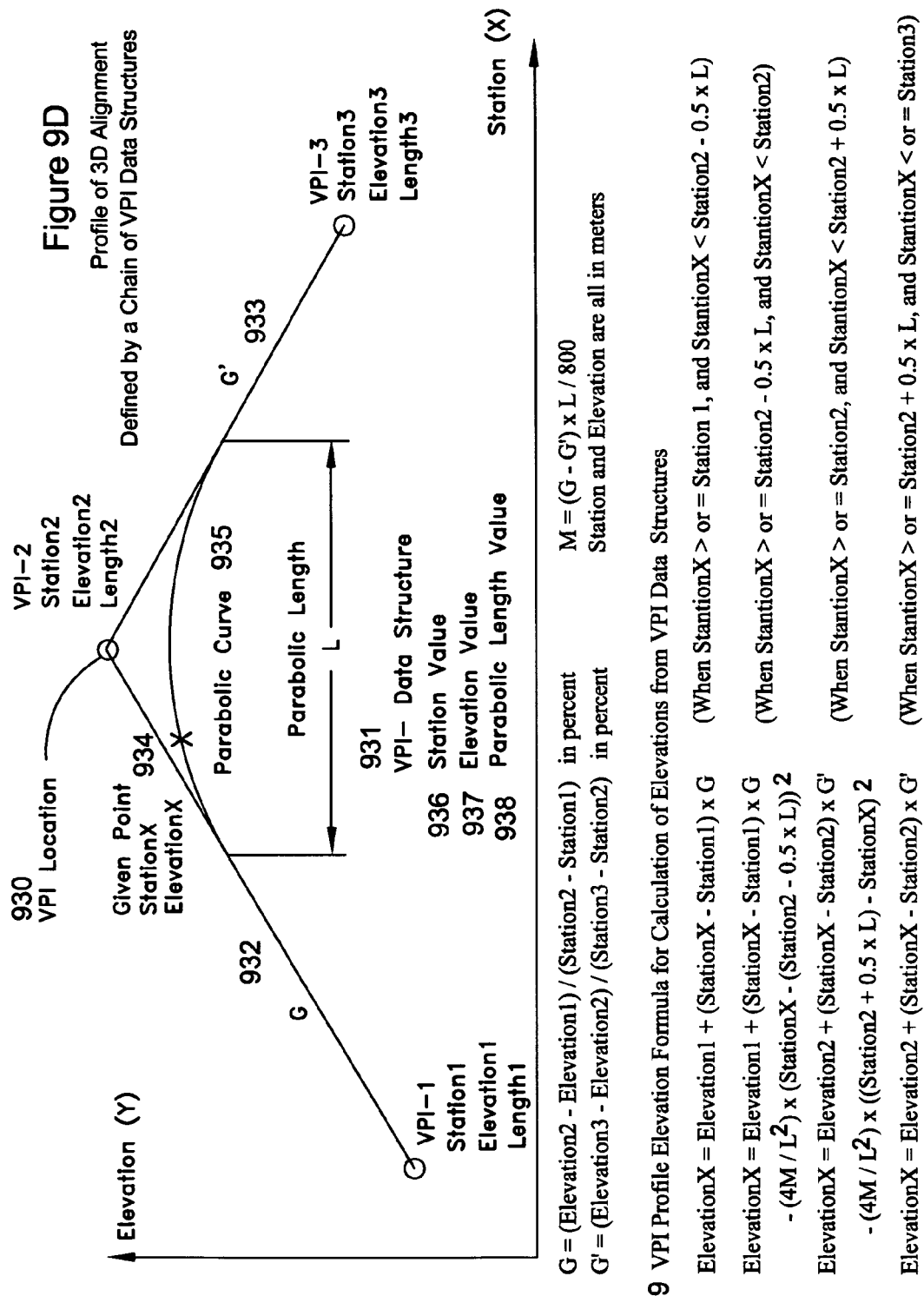

Figure 9D
Profile of 3D Alignment
Defined by a Chain of VPI Data Structures $G = (Elevation2 - Elevation1) / (Station2 - Station1)$ in percent
$G' = (Elevation3 - Elevation2) / (Station3 - Station2)$ in percent
$M = (G - G') \times L / 800$
Station and Elevation are all in meters 939 VPI Profile Elevation Formula for Calculation of Elevations from VPI Data Structures $ElevationX = Elevation1 + (StationX - Station1) \times G$ (When StantionX > or = Station 1, and StantionX < Station2 - 0.5 x L)

$ElevationX = Elevation1 + (StationX - Station1) \times G$
$- (4M / L^2) \times (StationX - (Station2 - 0.5 \times L))^2$ (When StantionX > or = Station2 - 0.5 x L, and StantionX < Station2)

$ElevationX = Elevation2 + (StationX - Station2) \times G'$
$- (4M / L^2) \times ((Station2 + 0.5 \times L) - StationX)^2$ (When StantionX > or = Station2, and StantionX < Station2 + 0.5 x L)

$ElevationX = Elevation2 + (StationX - Station2) \times G'$ (When StantionX > or = Station2 + 0.5 x L, and StantionX < or = Station3)

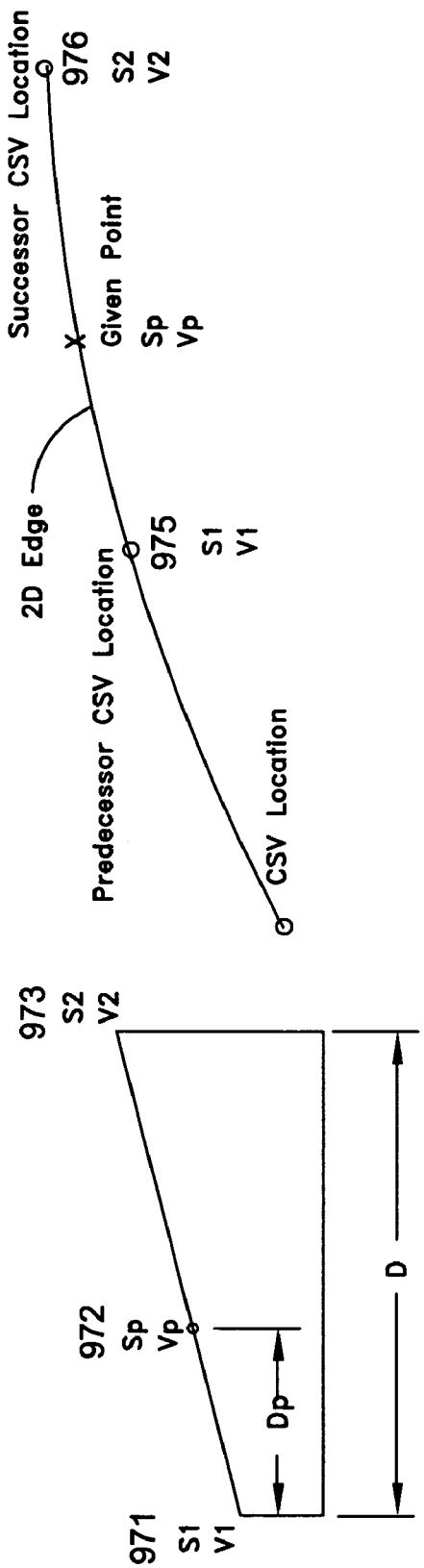
Figure 9F. CSV Profile Elevation Calculations

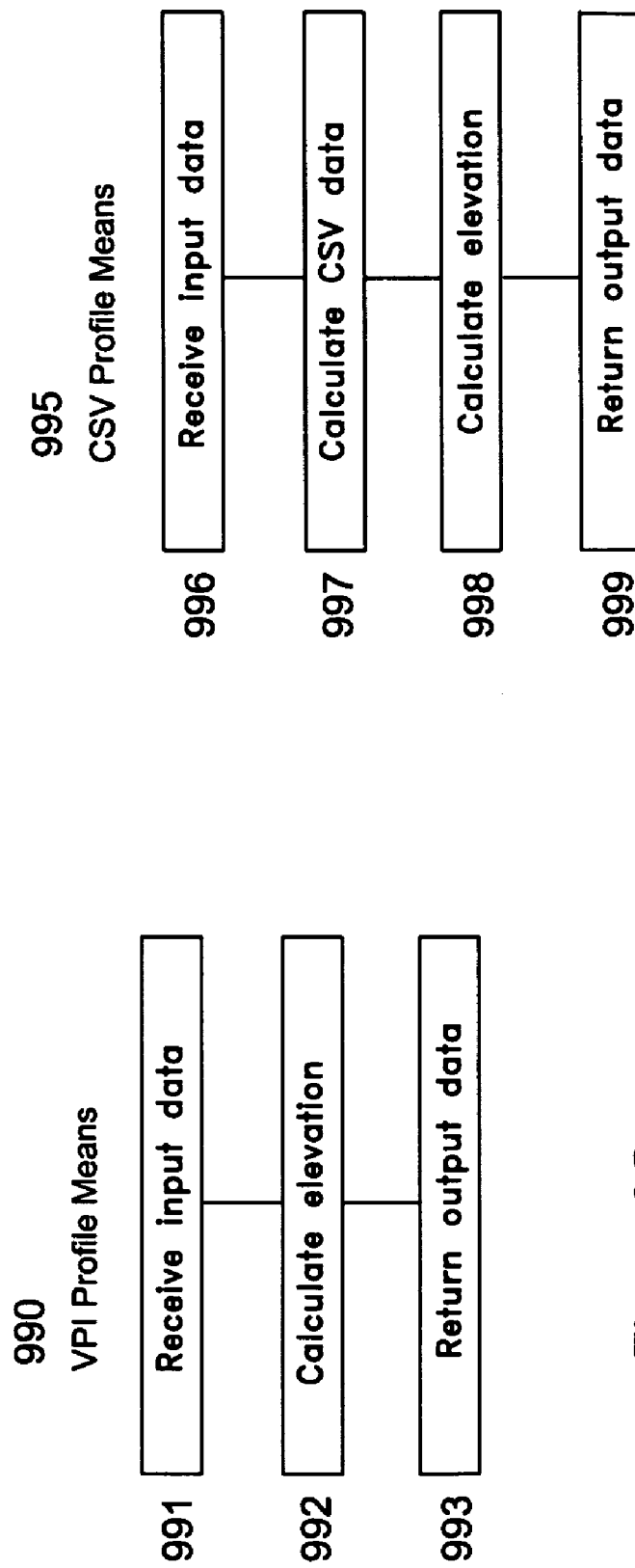

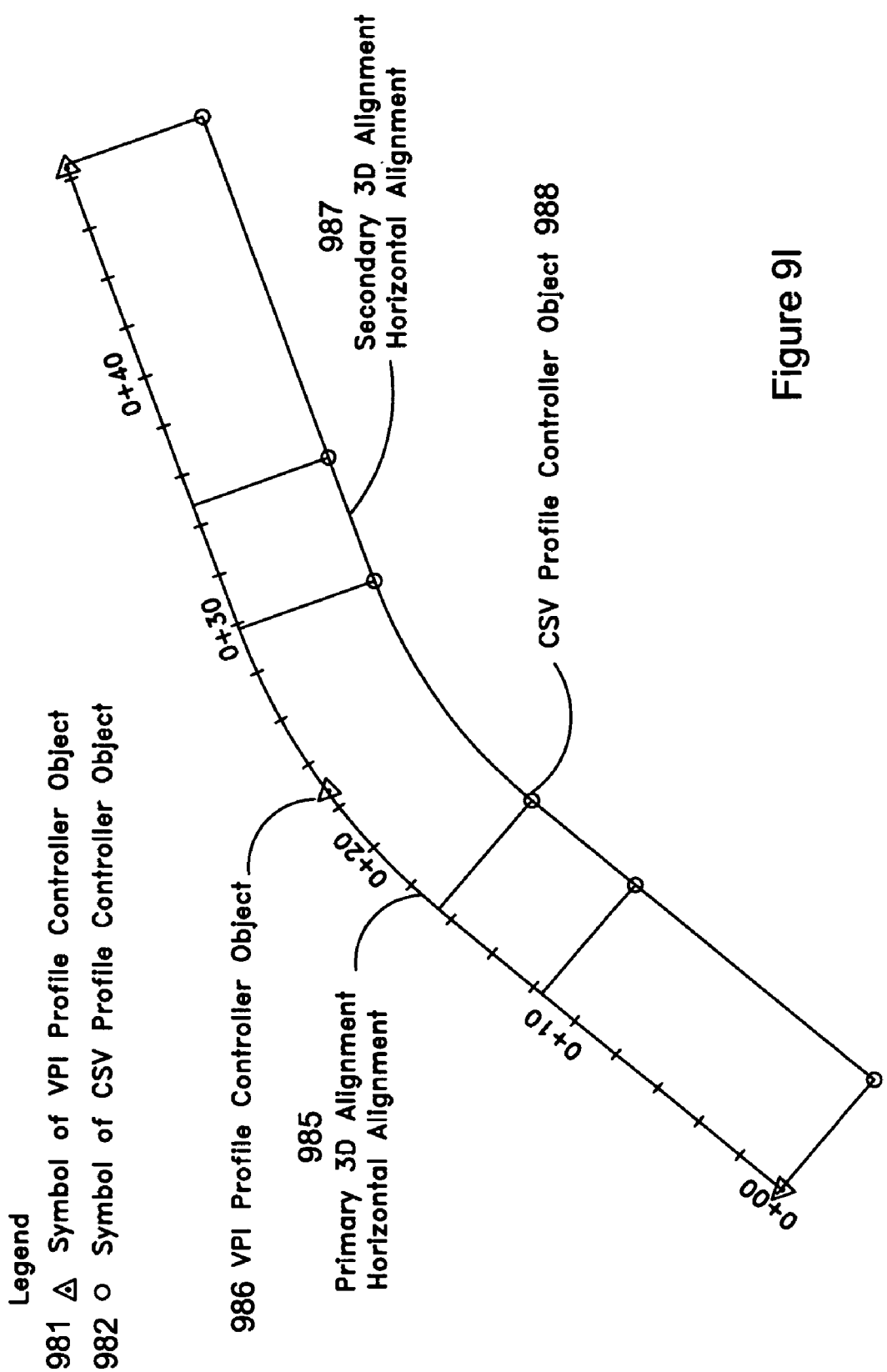

SYSTEM AND METHODS OF CIVIL ENGINEERING OBJECTS MODEL

CROSS-REFERENCE TO RELATED APPLICATIONS

This application claims the benefit of provisional patent application of this inventor, Application No. 60/786,408 File Date: Mar. 27, 2006

Title: System and Methods Of Civil Engineering Objects Model

This application also claims the benefit of provisional patent application of this inventor, Application No. 60/761,953 File Date: Jan. 25, 2006

Title: System and Methods for Civil Engineering Design Surface Modeling

FEDERAL SPONSORED RESEARCH

Not Applicable.

SEQUENCE LISTING OR PROGRAM

Not Applicable.

BACKGROUND OF THE INVENTION

Abbreviations

CAD—Computer Aided Design

GIS—Geographic Information System

3D—Three Dimensional

2D—Two Dimensional

PI—Point of Intersection

VPI—Vertical Point of Intersection

CSV—Cross Slope and Vertical fluctuation

FIELD OF INVENTION

The present invention relates to a system and methods for modeling three-dimensional civil engineering design components, and more particularly, to computer implemented civil engineering objects and their relative parametric models for defining and representing spatial positioning and 3D geometry of the civil engineering design components in a Cartesian coordinates system under computer aided design or geographic information system environment.

PRIOR ART FOR MODELING DESIGN COMPONENTS

In the conventional computer aided civil engineering design and geographic information systems, the civil engineering design components are mainly defined and represented by three types of geometric entities, points/nodes, lines/curves, and networks/surfaces in a Cartesian coordinates system. These geometric entities define spatial geometry and positioning of the civil engineering objects, but lack of abilities to define the outline geometry and key 3D dimensions of the civil engineering objects.

In the civil engineering design, numerous parametric models and construction details drawings are established to define the outline dimensions and construction details of the design components, but most of these parametric models and construction details drawings of the design components lack of connections and coordination with their spatial geometry and positioning in the civil engineering survey coordinates systems.

The integration of object spatial geometry and object outline geometry is necessary in the civil engineering design analysis. For example, in order to calculate the spatial clearance distance between outline perimeters of two pipes, both their spatial geometry of centerlines and outline geometry of pipe diameters are needed.

The civil engineering design components relate to each other in many different ways, such as the geometric connectivity, the horizontal clearances, and the vertical clearances. It's essential to incorporate various categories of civil engineering components into an integrated civil engineering objects model in order to support more comprehensive engineering analysis and minimize design interferences and conflicts. But, the civil engineering objects in the current computer aided civil engineering design systems lack of uniformity and flexibly to define and represent complete categories of civil engineering design components.

PRIOR ART FOR MODELING DESIGN SURFACE

The 3D geometry of a civil engineering design surface is commonly defined by its surface elevations and surfacing structure shapes and dimensions. In the conventional civil engineering design practices, the civil engineering design surfaces are mainly defined and designed in two ways, 1) by using roadway horizontal alignment, vertical alignment (also referred as profile) and cross sections, commonly known as template-based approach, 2) by using spot elevations, design contours and typical sections, commonly applied in grading design.

In the civil engineering design, the template-based approach uses three 2D drawings to define the 3D geometry of the design surfaces, including horizontal alignment and plane layout drawing, profile and super-elevation diagram drawing, and cross-sections drawing. The template-based approach is effective to model the roadway segments with consistent cross sections, but not effective to define non-linear features of design surfaces, such as roadway intersections, freeway entrance and exit ramps, parking lots etc. In addition, the horizontal alignment, profile and cross sections are presented and handled as three separate 2D drawings and are not convenient for design coordination and analysis.

The design surfaces with non-linear features are commonly handled by using spot elevations and design contours to define the surface elevations. The inconvenience of this approach is that spot elevations and design contours are not explicitly related to the design standards, and lack of abilities to support design analysis and coordination.

The conventional civil engineering design components modeling procedures are lack of uniformity and flexibility, and lack of integration and coordination capabilities. Many other disadvantages of the prior art will become apparent to one skilled in the art after comparing such prior art with the present invention as described herein.

OBJECTS AND ADVANTAGES

An objective of the present invention is to provide a uniform and flexible civil engineering objects system for defining and representing the three-dimensional civil engineering design components.

The civil engineering objects system of present invention defines and represents complete types and categories of civil engineering design components, which further supports integrated design analysis and coordination and minimize the design interference and conflicts.

Related CAD Information in Prior Art

A typical civil engineering CAD system or geographic information system comprises 1) a personal computer or computer network with operating systems, 2) a CAD engine that is a computer software to provide basic drafting functions and geometric calculation functions, such as AutoCAD by Autodesk Incorporation, Micro Station by Bentley Incorporation, and 3) specialty computer programs worked as add-on functions to a CAD engine software to provide specialized design functions, such as Land Desktop by Autodesk Incorporation, MX-Road by Bentley Incorporation. The CAD engine and specialty computer programs could be combined.

In the object-oriented programming environments for typical computer aided design or geographic information systems, every engineering component is treated as an object, i.e. the combination of data and methods that perform various functions.

Related Engineering Information in Prior Art

In the civil engineering design, 3D alignments are commonly used to define object centerlines, roadway control lines and surface edges. The 3D alignment, comprising continuous 3D lines and curves, is commonly defined by its horizontal alignment and vertical alignment (also known as profile). The horizontal alignment is 2D projection of the 3D alignment on the earth surface (X, Y) plane, commonly comprising continuous 2D lines, circular curves and spiral curves. The horizontal alignments are commonly shown on a 2D CAD drawing in a Cartesian coordinates system. The profile is elevation (Z) variations of the 3D alignment along its horizontal alignment, expressed as a function of station variable. The station of a point along the horizontal alignment is the 2D distance between the beginning point of the horizontal alignment and this point. The profile commonly consists of continues 2D lines and parabolic curves. The profile is commonly shown within 2D profile grids with coordinates of station (X) and elevation (Y) on a 2D CAD drawing in a Cartesian coordinates system.

In the civil engineering design, geometric definition data of the 3D alignment could be presented in many forms, for example, by the geometric definition data of its 3D lines and curves in a CAD drawing, or by mathematic formulas. The geometric definition data of the 3D alignment could also be represented by the geometric definition data of its horizontal alignment and the geometric definition data of its profile.

The geometric definition data of the horizontal alignment could be represented in the form of continuous 2D lines, circular curves and spiral curves in a CAD drawing, or by a chain of PI (point of intersection) data structures, in a Cartesian coordinates system. Each PI data structure contains coordinates (X,Y) of the PI location, and circular curve radius and two spiral curve lengths at this PI location.

Similarly, the geometric definition data of the profile could be represented in the form of continuous 2D lines and parabolic curves in a drawing, or by a chain of VPI (vertical point of intersection) data structures, in a Cartesian coordinates system. Each VPI data structure contains station, elevation, and parabolic curve length at this VPI location.

Geometric definition data of a 3D point could also be presented in many forms, for example, a 3D point in a CAD drawing, or a 3D point at a station along a 3D alignment, or 3D coordinates, in a Cartesian coordinates system.

In the civil engineering design, the section drawings are commonly used to define the geometry of the civil engineering design components. A section drawing is commonly the section view of a civil engineering design component cutting vertically (perpendicular to the earth surface plane) along a line.

As the common knowledge introduced in computational geometry, a ruled surface could be generated from two 3D alignments. The surface geometry is determined by the linear interpolation between two 3D alignments along the mesh lines, which is true to most of the civil engineering pavement design or grading design cases.

SUMMARY OF THE INVENTION

In a preferred aspect of the present invention, the commonly-used civil engineering design components, including existing and proposed, various forms and different disciplines, are abstracted as civil engineering objects. The civil engineering objects define and represent three-dimensional geometry and spatial positioning of the civil engineering design components through their positioning geometry data and relative parametric perimeters data, supported by a library of predefined relative parametric models. The relative parametric mode comprises a relative parametric drawing and relative parametric means (computer subroutines). The relative parametric drawing depicts and delineates elements of object positioning geometry and outline geometry, and designations of the relative parametric perimeters. The relative parametric perimeters define dimensions of key object geometric elements relating to the object positioning geometry. The relative parametric means provides pre-programmed functions to calculate object spatial coordinates and geometric features from the positioning geometry data and the relative parametric perimeters data according to the geometric relationships depicted in the relative parametric model drawing.

In the present aspect, the civil engineering objects are classified as different types based on the similarities in their positioning geometry. The types of civil engineering objects comprise spot object, linear object, surface object and other objects. The positioning geometry data of spot object is geometric definition data of a 3D point in a Cartesian coordinates system. The positioning geometry data of linear object is geometric definition data of a 3D alignment in the Cartesian coordinates system. The positioning geometry data of surface object is geometric definition data of two 3D alignments in the Cartesian coordinates system.

In the present aspect, each type of the civil engineering objects are further classified as predefined categories based on the similarities in their outline geometry and engineering characteristics. The relative parametric models are established per each civil engineering object category. The relative parametric models are pre-established for all civil engineering object categories for reuse, including predefined relative parametric drawings and pre-programmed relative parametric means.

In the present aspect, the 3D geometry of surface object is defined by a ruled surface and a relative parametric section. The ruled surface is generated from the two 3D alignments of the surface object positioning geometry. The relative parametric section defines the surface elevation variations and surfacing structure along the 3D mesh lines of the ruled surface.

In the present aspect, the 3D alignment, comprising continuous 3D lines and curves, is defined and represented by its horizontal alignment and profile. The profile is defined by a chain of VPI profile controller objects, or a chain of CSV profile controller objects. The VPI profile controller objects define the profile elevations through their VPI data structures. The CSV profile controller objects define the profile elevations though their CSV data structures and geometric data of a source 3D alignment for the profile.

Whereby the civil engineering objects define 3D geometry and spatial coordinates of civil engineering design components through their positioning geometry data and relative parametric perimeters data, supported by a library of pre-established relative parametric models, in a computer object-oriented CAD or GIS environment.

BRIEF DESCRIPTION OF THE DRAWINGS

FIGS. 1A to 1C show frameworks of the system and methods for modeling civil engineering design components, and concepts of the relative parametric model.

FIGS. 2A to 2B show general pattern for object data and method means.

FIGS. 4A to 4B illustrate applications of spot object.

FIGS. 5A to 5B show the object data and method means for linear object.

FIG. 6A illustrates applications of linear object.

FIGS. 7A to 7H show the object data and method means for surface object.

FIGS. 8A to 8H illustrate applications of surface object.

FIGS. 9A to 9I show a definition and representation system for profile of 3D alignment.

DETAILED DESCRIPTION OF THE INVENTION

Frameworks and General Patterns

In a preferred embodiment of the present invention, the system and methods for modeling civil engineering design components are implemented in a computer or a computer network, using object-oriented programming technology under CAD or GIS environments. Each civil engineering design component is defined and represented by a computer implemented programming object that comprises data and methods. The object data is saved in computer storage. The object methods provide computer subroutine means for various calculations and functions. The object graphic entities are shown in computer display.

Figure 1A:
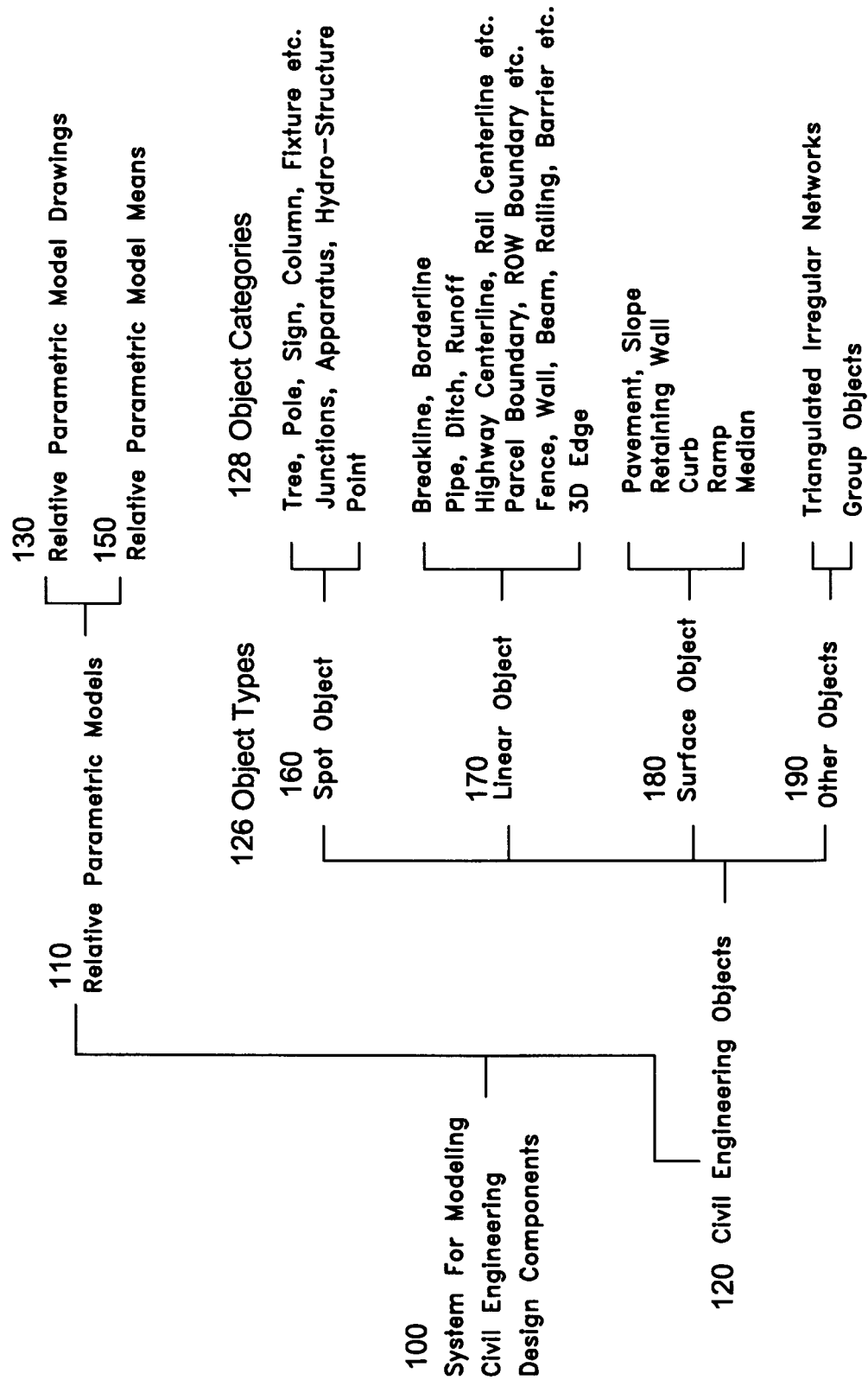

In the present embodiment, as shown in FIG. 1A, the system 100 for defining and representing civil engineering design components comprises various civil engineering objects 120 and a library of relative parametric models 110 that are pre-established to support geometric modeling and calculations of the civil engineering objects. Each pre-established relative parametric model further comprises a pre-defined relative parametric model drawing 130 and a pre-programmed relative parametric model means 150 that is a computer subroutine. The relative parametric models and their relative parametric model drawings and relative parametric model means are identified and referenced by their names consisting of strings, and stored in computers for reuse.

The civil engineering objects are classified as different types based on similarities in their positioning geometry. The types 126 of civil engineering object comprise spot object 160, linear object 170, surface object 180, and other objects 190. Each type of civil engineering objects are further classified as predefined categories 128 based on similarities in their outline geometry and engineering characteristics. Some sample civil engineering object categories are shown in the FIG. 1A, such as Pole category of spot object, Pipe category of linear object, and Pavement category of surface object.

In the present embodiment, 3D geometry and spatial positioning of a civil engineering object are defined by its positioning geometry data and relative parametric perimeters data according to the geometric relationships depicted in its relative parametric model drawing. The relative parametric model drawing depicts and delineates elements of object positioning geometry, reference points of the object positioning geometry on section view, elements of object 3D outline geometry, elements of object section outline geometry, and designations of relative parametric perimeters. (One skilled in the art would appreciate that the section view are commonly vertical section perpendicular to the earth surface plane, cutting along a pre-determined 2D line or curve on the earth surface plane.) The relative parametric perimeters define dimensions of key object geometric elements relating to the object positioning geometry so that spatial coordinates of the object geometric elements could be calculated and determined from the object positioning geometry data. The relative parametric means provide pre-programmed functions to calculate object spatial coordinates and geometric features from the positioning geometry data and the relative parametric perimeters data according to the geometric relationships depicted in the relative parametric model drawing. FIGS. 1B and 1C use a simple cuboid example to illustrate how the system works, assuming that the geometry of a design component is defined and represented by a cuboid in a Cartesian 3D coordinates system and all outline sides of the cuboid must be parallel to X axis, or Y axis, or Z axis.

FIG. 1B shows relative parametric model drawing 130 of the cuboid object in the perspective view 131 and in the top view 121. The positioning geometry of the cuboid object is defined by the 3D coordinates (Xa, Ya, Za) of its vertex point A 132. The relative parametric perimeters comprise length L 133, width W 135 and height H 136 as shown on the perspective view. The relative parametric perimeters further comprise distance Wp 128 and distance Lp 129 between a given point P 127 on the top surface of the cuboid and the position geometry point A 122 along X axis and Y axis, and these distances define the positioning coordinates of the given point P 137 on the top surface relating to the positioning geometry point A 132 of the cuboid. (One skilled in the art would appreciate that additional distances could be designated to define the positioning geometry of any given point within the cuboid relating to the positioning geometry point A of the cuboid.) (One skilled in the art would appreciate that the positioning geometry point data and relative parametric perimeters data fully define the 3D geometry and spatial positioning of the cuboid object.) (One skilled in the art would appreciate that certain angles between the sides of cuboid and certain axis of the Cartesian coordinates system are needed to determine the spatial positioning of the cuboid in addition to the positioning geometry point if the sides of the cuboid are not parallel to the axis of the Cartesian coordinates system.)

In the present embodiment, FIG. 1C shows the relative parametric model means for calculating 3D geometric features and spatial coordinates of a civil engineering object from its positioning geometry data and relative parametric perimeters data according to the geometric relationships depicted in its relative parametric model drawing. The relative parametric model means 150 perform the calculation functions with steps of 151 receiving input data for the geometric positioning data and relative parametric perimeters data, 152 using proper geometric formulas derived from the geometric relationships depicted in the relative parametric model drawing, 153 calculating geometric features including spatial coordinates with the geometric formulas, and 155 returning output data for the calculated geometric features. FIG. 1C also shows some sample geometric formulas derived from the relative parametric model drawing of the cuboid object, for calculating its top surface area 156, volume 157 and spatial coordinates of a given point on the top area 158. (One skilled in the art would appreciate that the geometric formulas necessary for calculating object spatial coordinates and geometric features could be derived from the geometric relationships depicted in the relative parametric drawing using conventional geometry knowledge in mathematics.)

In the civil engineering design, the object spatial coordinates and geometric features are mainly used to verify connectivity and spatial clearances and estimate quantities. The object spatial coordinates and geometric features are not intended to provide fabrication and construction details for the civil engineering objects. One skilled in the art would appreciate that the standard fabrication and construction details could be organized per each civil engineering object category and stored together with pertinent relative parametric models for reuse to increase design productivities.

In the present embodiment, as shown in FIG. 2A, the general pattern of object data and method means 200 for a civil engineering object comprise:

a) positioning geometry data 210 for defining three-dimensional geometry and spatial positioning of the civil engineering object in a Cartesian coordinates system, (One skilled in the art would appreciate that the Cartesian coordinates system is commonly located based on survey coordinates datum, while X and Y coordinates commonly correspond to the earth surface plane and Z coordinate commonly corresponds to the elevation), b) relative parametric model name data 220 for specifying name of the relative parametric model that applies to the civil engineering object, and c) relative parametric perimeters data 230 for specifying values of the relative parametric perimeters, and d) geometric calculation means 290 for calculating spatial coordinates and three-dimensional geometric features of the civil engineering object from its positioning geometry data and its relative parametric perimeters data, supported by the relative parametric model for the civil engineering object, e) engineering attributes data 250 for specifying descriptive engineering characteristics of the civil engineering object, and f) graphic representation data 260 for representing the civil engineering object in a drawing with a collection of graphic entities and display styles, and g) object relationships data 280 for specifying geometric and engineering relationships of the civil engineering object with other civil engineering objects, and h) object identification data 270 for identifying the civil engineering object in an engineering system.

As shown in FIG. 2B, the geometric calculation means 290 (computer subroutine) for calculating spatial coordinates and 3D geometric features of the civil engineering object, comprise following steps, 295 receiving input data for the positioning geometry data and relative parametric perimeters data, 296 using relative parametric model means applied to the civil engineering object, 297 calculating geometric features including spatial coordinates supported by the relative parametric model means, and 298 returning output data for the calculated geometric features of the civil engineering object.

{Spot Object Modeling}

Figures 3A, 3B:
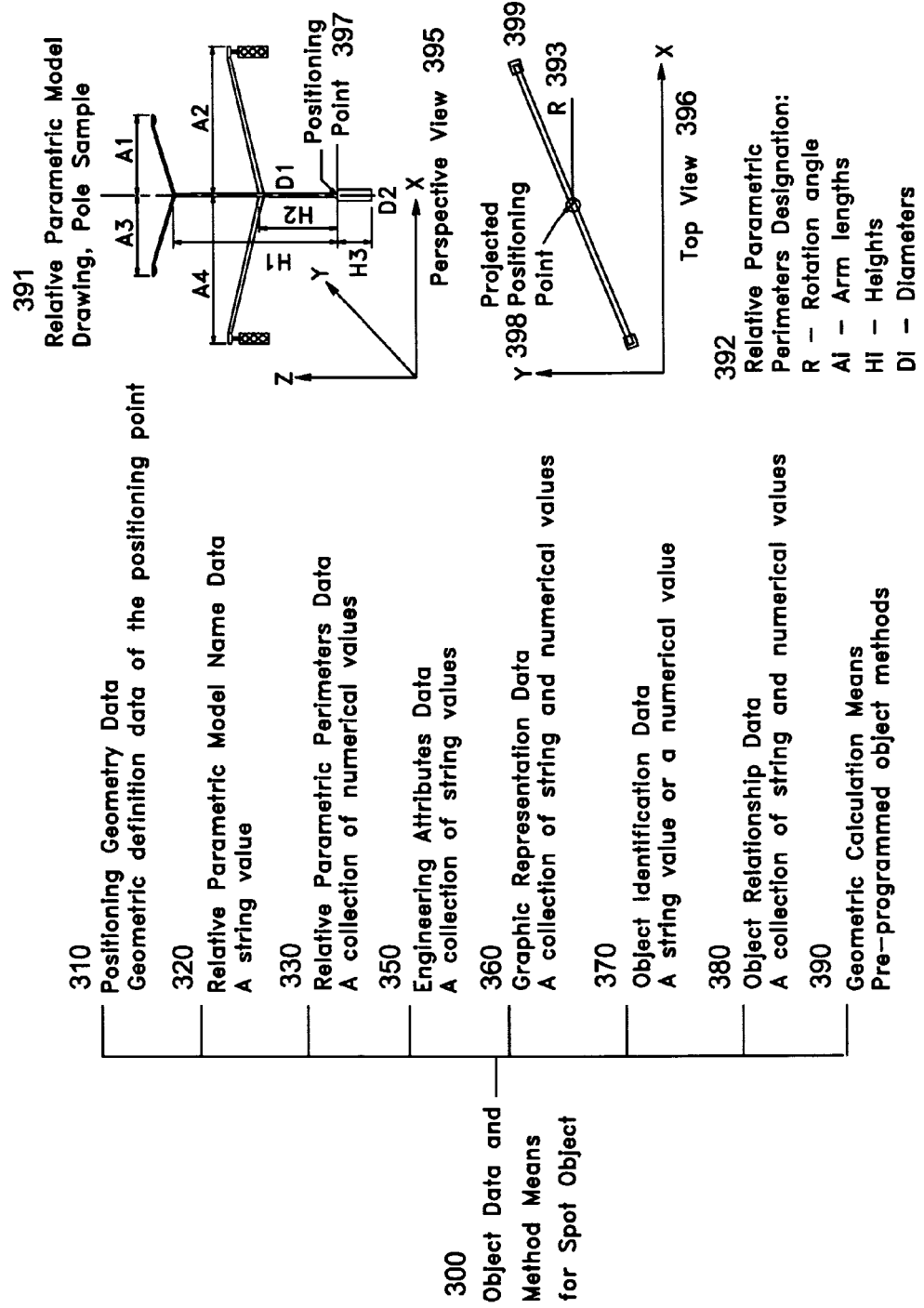
FIGS. 3A to 3B show the object data and method means for spot object.

In the present embodiment, FIG. 3A shows the object data and method means of spot object 300 that are detailed out from the general pattern 200 as shown in FIG. 2A in the following manner, i) positioning geometry data 310 is geometric definition data of a 3D point in a Cartesian coordinates system, the point serves as positioning geometry for determine the spatial positioning of the spot object, referenced as positioning point in the document. (One skilled in the art would appreciate that the geometric definition data of a 3D point could be presented in many forms, such as X, Y, Z coordinates, a point on a line or a curve, the distances relating to another point and so on.)

j) relative parametric model name data 320 is commonly a string value.

k) relative parametric perimeters data 330 are commonly a collection of numerical values. (One skilled in the art would appreciate that the relative parametric perimeters for a spot object must comprise rotation angles between pre-defined reference lines and certain coordinates axis to determine the spatial coordinates of the outline geometry elements relating to the positioning point.)

l) geometric calculation means 390 are commonly implemented as computer program methods of spot object for calculating it spatial coordinates and three-dimensional geometric features from its positioning geometry data and its relative parametric perimeters data.

m) engineering attributes data 350 are commonly a collection of string values.

n) graphic representation data 360 are commonly graphic entities data and display styles data for displaying the spot object in a drawing under a CAD or GIS environment.

o) object relationships data 380 are commonly a collection of string values and numeric values for specifying geometric and engineering relationships of the civil engineering object with other civil engineering objects, such as identifications of related civil engineering objects, relation types and relation values.

p) object identification data 370 is commonly a string value or a numeric value to identify the spot object in an engineering system.

In the civil engineering design, the spot objects are commonly represented by a predefined graphic symbol in drawings. Designers commonly store a library of predefined graphic symbols in computers for reuse. The graphic symbols are commonly identified by their names. One skilled in the art would appreciate that the graphic entities data of spot object could be specified by the name of a predefined graphic symbol block, and the display styles of spot object may include block insertion scale, layer, color and so on, using the terms in AutoCAD software.

In the present embodiment, FIG. 3B illustrates the relative parametric model drawing using Pole category of spot objects as an example. The drawing is shown in 3D perspective view 395 and top view 396 that is the projection of the Pole on the earth surface plane, the X, Y plane. The positioning point 397 is commonly along the vertical centerline of the pole at the pavement or earth ground level. The relative parametric perimeters 392 include the rotation angle R 393 between the pole projection line 399 and X axis on the top view 396 at the projected positioning point 398, arm lengths of signal and light arms, heights and diameters of pole segments and foundation. One skilled in the art would appreciate that, since the Pole is always perpendicular to X, Y, plane, the positioning point 397, the rotation angle 393 and other relative parametric perimeters fully determine the 3D geometry and spatial positioning of the Pole. The detailed Pole fabrication dimensions are handled as separate construction details drawings. One skilled in the art would appreciate that the relative parametric model drawing could be established for other spot object categories in the similar manner as Pole category of spot objects.

In the present embodiment, FIG. 4A illustrates application of spot object using the Tree category of spot object as an example. The graphic representation 410 of tree category of spot object is a graphic symbol 411 with a positioning point 413. The positioning geometry data of the spot object is 3D coordinates of its positioning point. The engineering attributes 430 for Tree category of spot objects comprise botanical name, common name, family, ecological classification, foliage form and so on. The relative parametric model drawing 440 for the Tree category of spot object depict the positioning point, the elements of 3D outline geometry, and designation of the relative parametric perimeters 446 relating to the positioning point, including tree top height, stem height, root depth, top diameter, shadow diameter, stem diameter, rooting diameter. The object data and method means of spot object could be used to support various engineering analysis, such as calculating shadowing areas of trees, determining quantities etc.

FIG. 4B shows an example to depict how the foundation clearance 470 between a catch basin of spot object 460 and a lighting pole of spot object 480 is determined from their foundation outline 462 and 482 calculated by their geometric calculation means from their positioning geometry data and relative parametric perimeters data. As shown, the distance between their graphic symbols 461 and 481 does not reflect the real clearance between their foundation outlines. (One skilled in the art would appreciate that the similar analytical calculations could be conducted for various categories of civil engineering object.)

{Linear Object Modeling}

In the present embodiment, FIG. 5A shows the object data and method means of linear object 500 that are detailed out from the general pattern 200 as shown in FIG. 2A in the following manner, a) positioning geometry data 510 is geometric definition data of a 3D alignment in a Cartesian coordinates system, the 3D alignment serves as positioning geometry for determine the spatial positioning of the linear object, referenced as positioning centerline in the document. (One skilled in the art would appreciate that geometric definition data of the 3D alignment could be presented in many forms, such as continuous 3D line and curve entities in CAD drawing, or a horizontal alignment and a profile.)

b) relative parametric model name data 520 is commonly a string value.

c) relative parametric perimeters data 530 are commonly a collection of numerical values.

d) geometric calculation means 590 are commonly implemented as computer program methods of linear object for calculating it spatial coordinates and three-dimensional geometric features from its positioning geometry data and its relative parametric perimeters data.

e) engineering attributes data 550 are commonly a collection of string values.

f) graphic representation data 560 are commonly graphic entities data and display styles data for displaying the linear object in a drawing under a CAD or GIS environment.

g) object relationships data 580 are commonly a collection of string values and numeric values for specifying geometric and engineering relationships of the civil engineering object with other civil engineering objects, such as identifications of related civil engineering objects, relation types and relation values.

h) object identification data 570 is commonly a string value or a numeric value to identify the linear object in an engineering system.

In the civil engineering design, the linear objects are commonly represented by its horizontal alignment, its profile and its cross sections, shown in different drawings. (One skilled in the art would appreciate that the cross section of the linear object is the vertical section cutting perpendicular to the earth surface plane, along a 2D line on the earth surface plane and perpendicular to the positioning centerline of linear object.)

In the present embodiment, FIG. 5B illustrates the relative parametric model drawing 591 using Wall category of linear objects as an example. The relative parametric model drawing of linear object uses the cross section view drawing. The reference point 592 of the positioning centerline on the cross section view is projection of the positioning centerline on the cross section view. The relative parametric perimeters 593 include the heights and width of the Wall segments on the cross section view, designated relating to the reference point of the position centerline. (One skilled in the art would appreciate that, the 3D geometric features and spatial positioning of a linear object could be determined and calculated from its positioning geometry data and relative parametric perimeters data according to the geometric relationships depicted in its relative parametric model drawing on the cross section view using conventional geometry knowledge in mathematics.)

In the present embodiment, FIG. 6A illustrates application of linear object using the Pipe category of linear objects as an example. The graphic representation 610 of Pipe category of linear object is the horizontal alignment of its positioning centerline displayed with a special line type comprising symbol "W" to indicate waterline pipe. The positioning geometry of the Pipe category of linear object is defined by the geometric definition data of its horizontal alignment 611 and profile 621 of its positioning centerline. The engineering attributes 630 for Pipe category of linear objects comprise pipe type, model, material, class, roughness and so on. The relative parametric model drawing 650 on the cross section view of Pipe category of linear object comprise the reference point 651 of its positioning centerline, the elements of its cross section geometry, and the designation of its relative parametric perimeters 680 including pipe diameter and thickness. The relative parametric model means are pre-programmed using the geometric relationships depicted in the relative parametric model drawings and conventional geometry knowledge. The object data and method means of Pipe category of linear objects are also used to support various engineering analysis, such as calculating pipe flow capacity, calculating vertical clearance of two crossing pipes, determining quantities etc.

{Surface Object Modeling}

In the present embodiment, the surface object is defined by a ruled surface with mesh lines that are generated from two 3D alignments, and relative parametric sections that define the section geometry along the mesh lines. FIG. 7A shows the object data and method means of surface object 700 that are detailed out from the general pattern 200 as shown in FIG. 2A in the following manner.

a) Positioning geometry data 710 is geometric definition data of two 3D alignments in a Cartesian coordinates system, the two 3D alignments serve as positioning geometry for determine the spatial positioning of the surface object, referenced as primary 3D edge and secondary 3D edge in the document. (One skilled in the art would appreciate that the primary 3D edge and the secondary 3D edge commonly represent control line or centerline of roadway, edge of pavement and shoulder, and other surface edges, in the civil engineering design.)

b) Relative parametric model name data 711 is commonly a string value.

c) Relative parametric perimeters data 712 are commonly a collection of numerical values.

d) Geometric calculation means 713 are commonly implemented as computer program methods of surface object for calculating it spatial coordinates and three-dimensional geometric features from its positioning geometry data and its relative parametric perimeters data, and the geometric calculation means of surface object further comprises relative parametric section means for calculating the elevations along a mesh line of the ruled surface, and linear interpolation means for calculating the elevation at a given point between two adjacent mesh lines of the ruled surface.

e) Engineering attributes data 715 are commonly a collection of string values.

f) Graphic representation data 716 are commonly graphic entities data and display styles data for displaying the surface object in a drawing under a CAD or GIS environment.

g) Object relationships data 717 are commonly a collection of string values and numeric values for specifying geometric and engineering relationships of the civil engineering object with other civil engineering objects, such as identifications of related civil engineering objects, relation types and relation values.

h) Object identification data 718 is commonly a string value or a numeric value to identify the surface object in an engineering system.

i) Mesh line generation means 719 is added to for generating the mesh line of ruled surface from the primary 3D edge and secondary 3D edge.

In the present embodiment, as illustrated by Curb category of surface object in FIG. 7B, the relative parametric model drawing 721 of the surface object further comprises mesh lines drawing 722 of the ruled surface, and a relative parametric section drawing 726. The ruled surface and its mesh lines 725 are generated from the primary 3D edge 723 and the secondary 3D edge 724 of the surface object. The relative parametric section drawing 726 comprise two reference points 727 and 728 of the primary 3D edge and the secondary 3D edge on the section view, elements of the section geometry, and designations of relative parametric perimeters 729, for defining section geometry along the mesh lines. (One skilled in the art would appreciate that the two reference points of the primary 3D edge and the secondary 3D edge are their projection points on the section view, and the sections are the vertical sections along the mesh lines.)

In the present embodiment, the surface object is represented by its ruled surface with mesh lines in drawing. As shown in FIG. 7C, the ruled surface and its mesh lines are generated from the primary 3D edge and the secondary 3D edge using the perpendicular method 730, or using the distributed method 735. In the perpendicular method, all mesh lines are perpendicular to the primary 3D edge 731 and intersect to secondary 3D edge 732, at pre-determined mesh line spacing 733 calculated by dividing the horizontal alignment length of the primary 3D edge by the pre-determined number of mesh lines. In the distributed method, the pre-determined number of mesh lines are formed in such manner that the end points of all mesh lines are evenly distributed along both primary 3D edge 738 and secondary 3D edge 739, while the mesh line spacing lengths 736 along primary 3D edge and the mesh line spacing lengths 737 along the secondary 3D edges are determined by dividing their own horizontal alignment lengths by the pre-determined number of mesh lines.

In the present embodiment, the surface object comprises a mesh line generation means that is a computer program for calculating the mesh lines of ruled surface. As shown in FIG. 7D, the mesh line generation means 743 comprises function steps of, 746 receiving geometric definition data for the primary 3D edge and secondary 3D edge, 747 calculating the mesh lines for the ruled surface with pre-determined mesh line spacing data using perpendicular method or using distributed method, and 748 returning mesh lines data. (One skilled in the art would appreciate that conventional geometry formulas in mathematics are used to calculate mesh lines.)

Figures 7E, 7F:
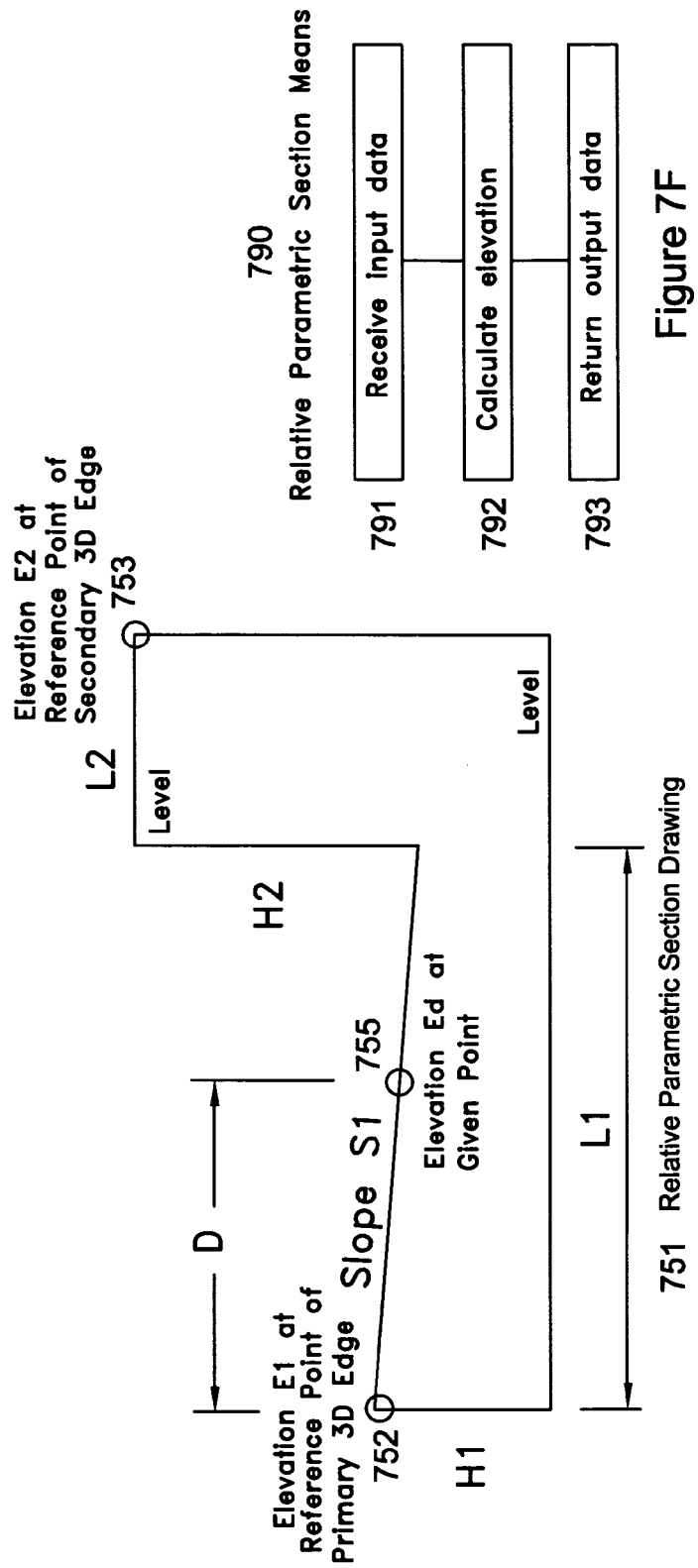

In the present embodiment, FIG. 7E illustrates the relative parametric section drawing and its use in the relative parametric section means of surface object, using Curb category of surface objects as an example. The relative parametric section drawing 751 depicts and delineates the reference point 752 of primary 3D edge and reference point 753 of the secondary 3D edge, the elements of section geometry, and designation of the relative parametric perimeters 757. Some of the relative parametric perimeters are variables depending on the mesh line geometry and values of other relative parametric perimeters. For example, the relative parametric perimeter L1 758 is variable and its value is calculated by subtracting L2 from the projection length of the mesh line on the earth surface plane at this section. The mesh line elevation formula 756 is pre-derived to calculate the elevation at a given point 755 along the mesh line section according to the elevation at the reference point 752 of the primary 3D edge that could be calculated from the geometry definition data of the primary 3D edge. (One skilled in the art would appreciate that some of the relative parametric perimeters of surface object must be variables, and these variables are determined from the variable geometry of the mesh line at this section and the constant values of other relative parametric perimeters.)

In the present embodiment, the geometric calculation means of surface object further comprise a relative parametric section means for calculating surface elevations along the mesh lines of the ruled surface. As shown in FIG. 7F, the relative parametric section means 790 comprise function steps of, 791 receiving geometric definition data of the mesh line at the section and the given point along the mesh line, 792 calculating the elevation at the given point, and 793 returning the elevation value. (One skilled in the art would appreciate that the formulas for calculating the elevation at a given point along a mesh line are pre-derived according to the geometric relationships depicted in the relative parametric section drawing using conventional geometric knowledge in mathematics.)

In the present embodiment, the geometric calculation means of surface object further comprise a linear interpolation means for calculating the surface elevations between two adjacent mesh lines. As shown in FIG. 7H, the linear interpolation means 770 comprise function steps of, 771 receiving geometric definition data of the given point, 772 finding two adjacent mesh lines, 773 calculating the elevations at the perpendicular points of two adjacent mesh lines using the relative parametric section means, 775 calculating the elevation at the given point using the linear elevation interpolation formulas 760 shown in FIG. 7G 775, and 776 retuning the elevation. As shown in FIG. 7G, the linear elevation interpolation formula 760 is used for calculating the elevation at a given point Ep 769 from the elevations E1 765 at perpendicular point of one adjacent mesh line 763 and elevation E2 766 at the perpendicular point of another mesh line 764 according to perpendicular distances D1 767 and D2 768. (One skilled in the art would appreciate that the two adjacent mesh lines of a given point, the perpendicular point and distance could be calculated by using conventional geometric methods in mathematics.)

Figure 8A:
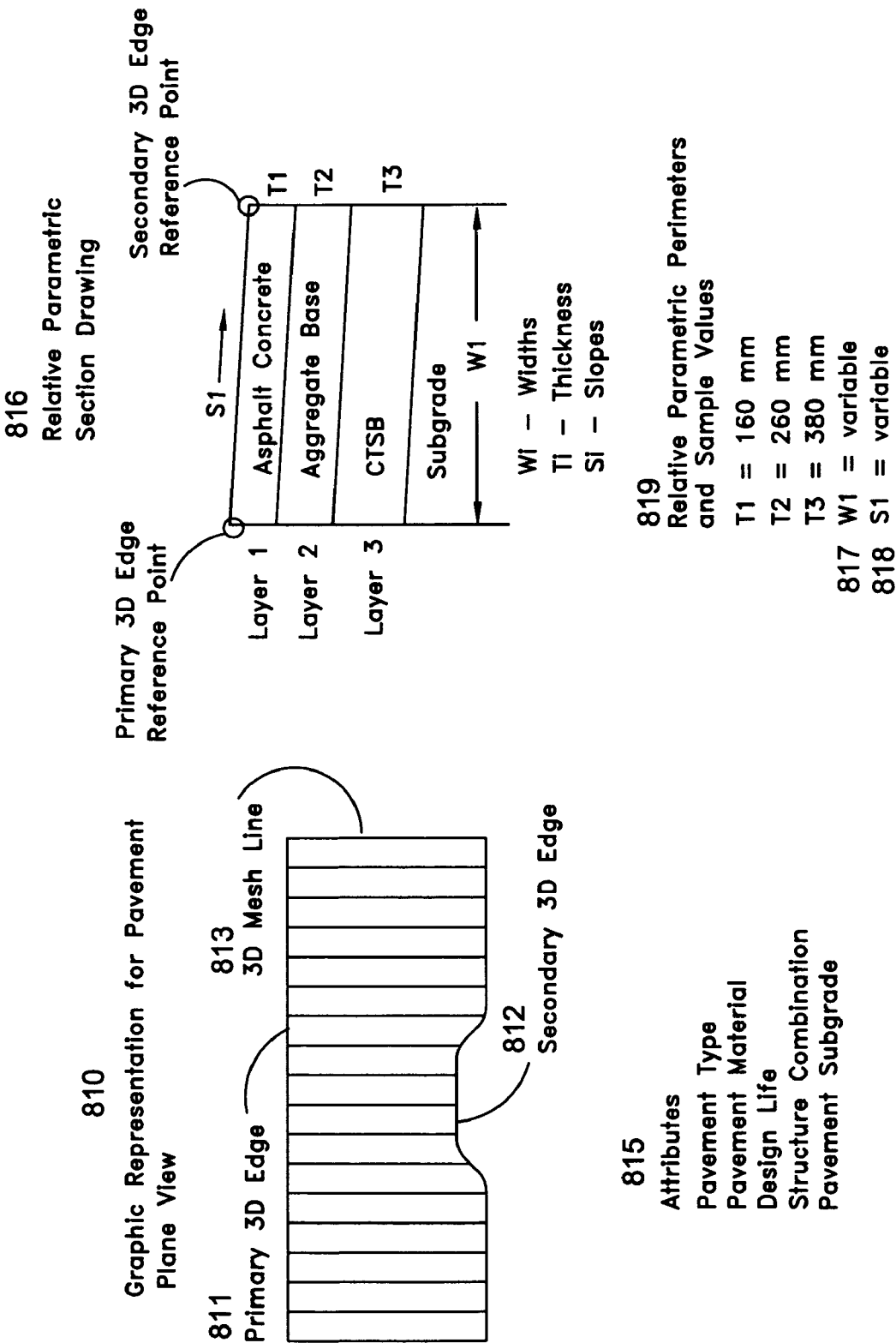

In the present embodiment, FIG. 8A illustrates application of surface object using the Pavement category of surface objects as an example. The graphic representation 810 of the surface object is the mash lines 813 of ruled surface, the primary 3D edge 811 and the secondary 3D edge 812. The positioning geometry of the Pavement category of surface object is defined by the primary 3D edge 811 and the secondary 3D edge 812. The engineering attributes 815 for Pavement category of surface objects comprise pavement type, pavement material, design life, structure combination, and pavement sub-grade. The relative parametric section drawing 816 for Pavement category of surface object depicts and delineates the reference points of primary 3D edge and secondary 3D edge, the section geometry along the mesh lines, and the designation of the relative parametric perimeters 819, including pavement width, slope and layer thicknesses. One skilled in the art would appreciate that, the relative parametric perimeters W1 817 and Si 818 are variables, and have the same geometry values as the mesh line at this section. (One skilled in the art would appreciate that the geometric definition data for primary 3D edge and secondary 3D edge, and relative parametric perimeters data could define 3D geometry and spatial positioning of the surface objects, supported by their relative parametric models.)

Figure 8C:
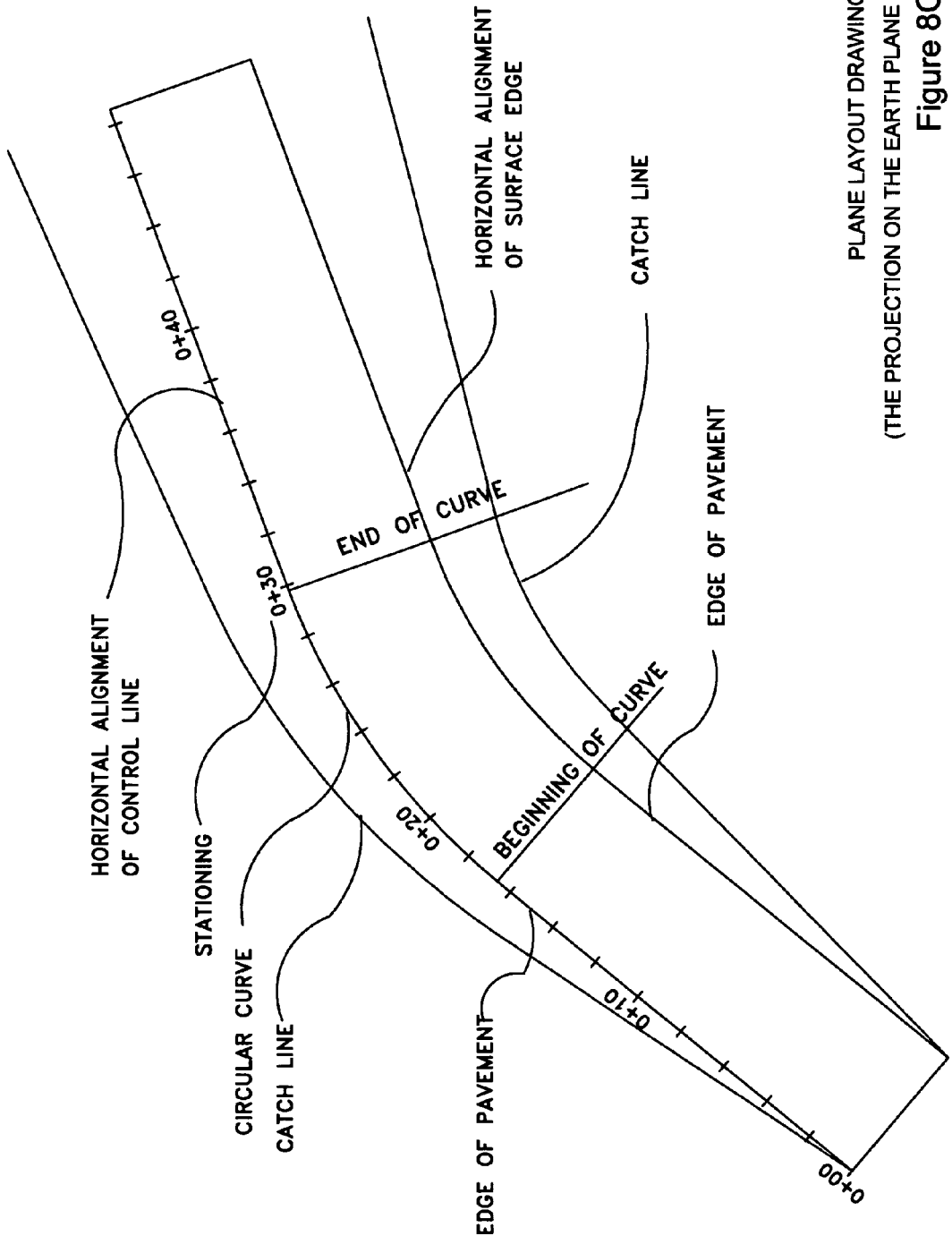
Figure 8F:
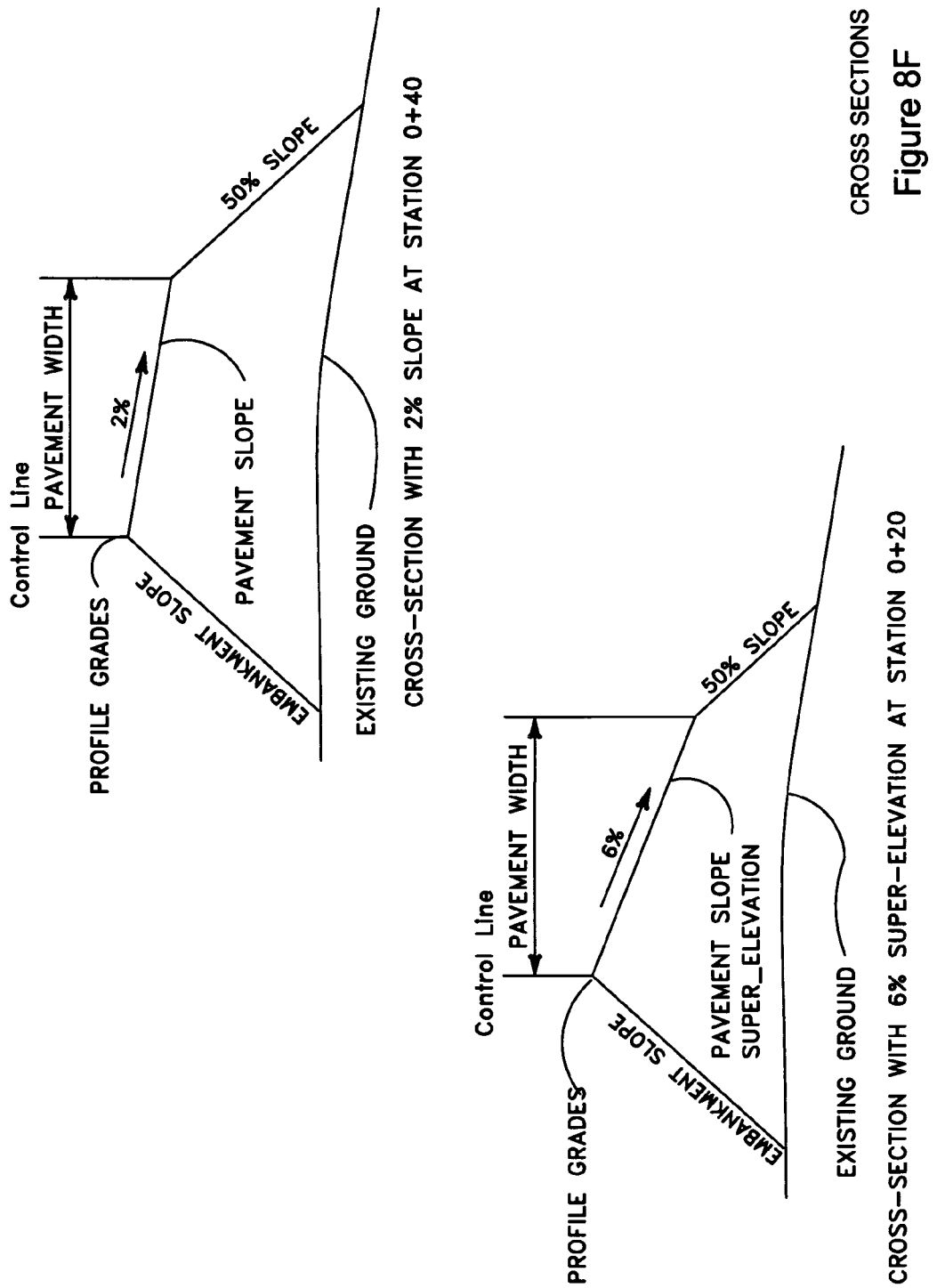

FIGS. 8B to 8H illustrate how a segment of roadway with pavement and embankment is modeled in conventional manner and by the surface object. In the civil engineering design, the conventional template-based approach uses three 2D drawings to define the 3D geometry of the design surfaces, which is depicted by FIGS. 8B to 8G. FIG. 8B shows perspective view of 3D design surfaces of a segment of roadway embankment and pavement. FIG. 8C shows the plane layout drawing, i.e. projections of the roadway surfaces on the earth surface plane, including horizontal alignments of the control-line and other surface edges. FIG. 8D shows the profile drawing, i.e. the vertical (perpendicular to the earth surface plane) section elevations along the horizontal alignment of the control-line, including existing ground profile and newly-designed surface profile. FIG. 8E shows a super-elevation diagram which define pavement cross slopes along the horizontal alignment. FIG. 8F shows the cross-section drawings, i.e. the vertical sections cutting along the 2D lines on the earth surface plane and perpendicular to the horizontal alignment, at certain intervals along the horizontal alignment of control-line.

Figure 8G:
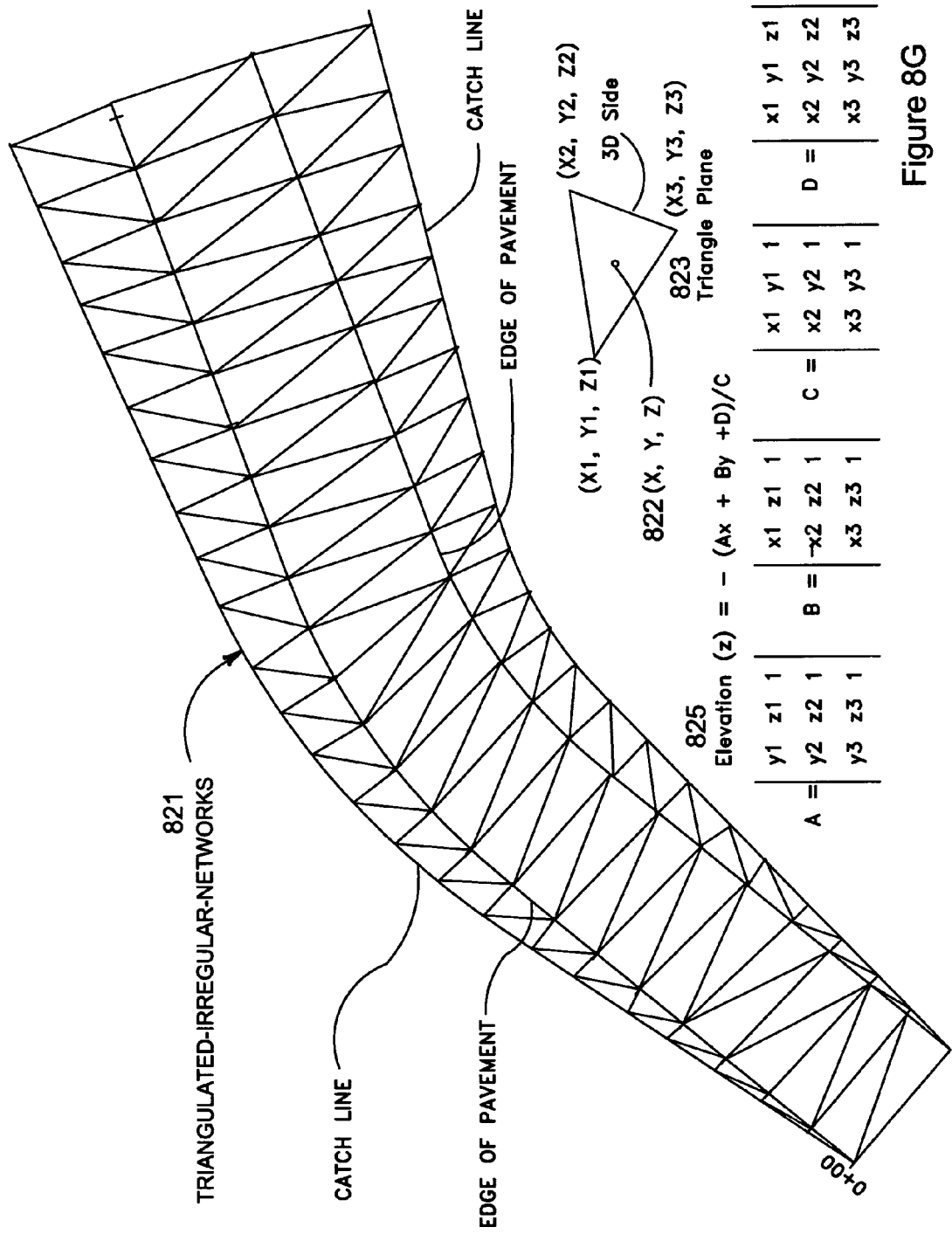

As shown in FIG. 8G, the segment of roadway surface could also be modeled by the triangulated-irregular-networks 821. One skilled in the art would appreciate that the triangulated-irregular-networks connect 3D points with 3D lines to form triangles, and the 3D triangles define and represent the elevations of the design surfaces. The 3D points could be obtained from survey data or surface design data. The elevation at a given point 822 on a triangle plane 823 could be calculated through the elevation formula 825. In the civil engineering design, triangulated-irregular-networks objects are commonly used to defined and represent the natural terrain surfaces and grading design surfaces.

Figure 8H:
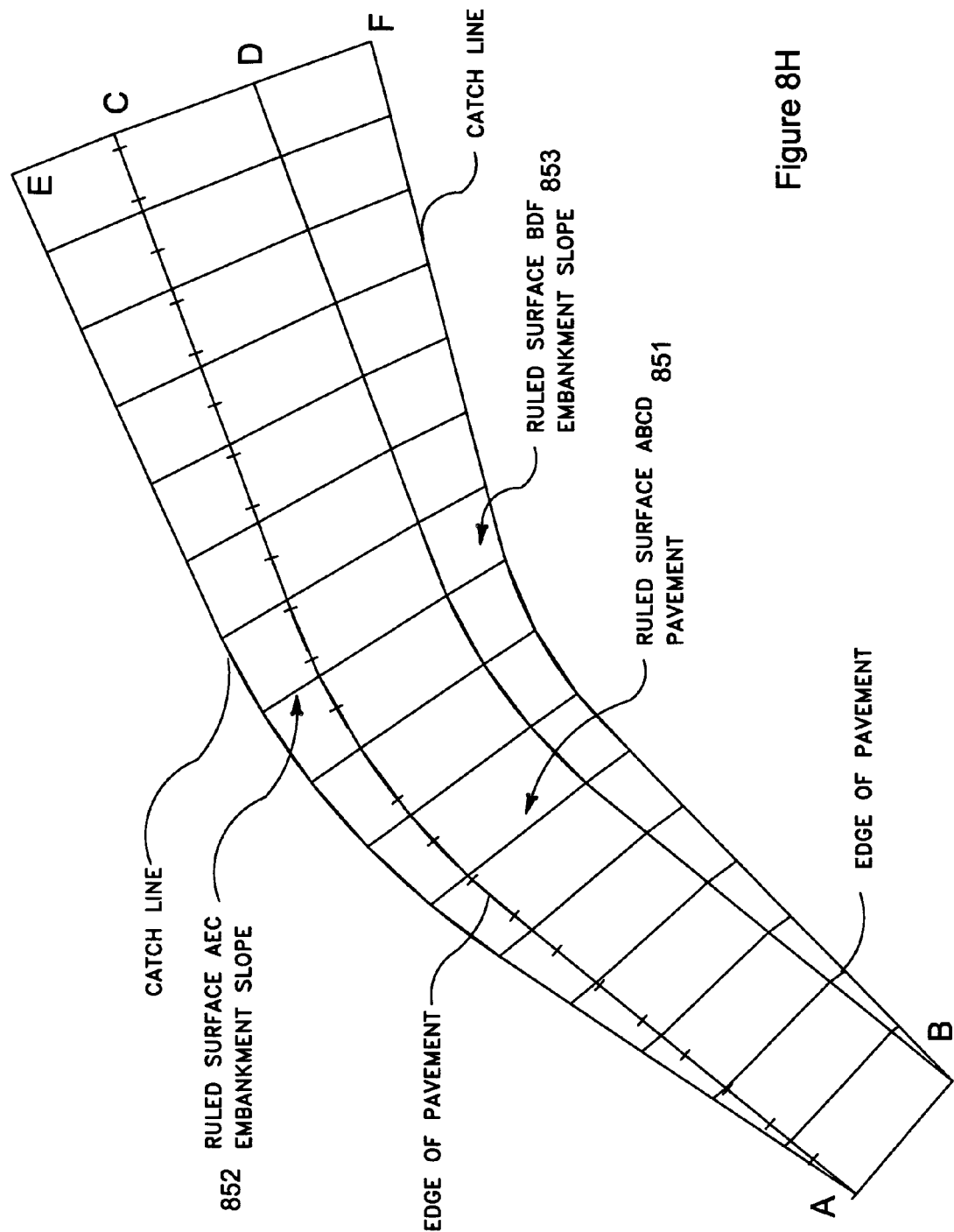

FIG. 8H illustrates the segment of roadway surface are defined and represented by three surface objects. The surface object 851 within area ABCD represents the pavement area with primary 3D edge AC. The surface object 852 within area AEC and the surface object 853 within area BDF represent the embankment slope areas with primary 3D edge AC and BD.

{Defining and Representing 3D Alignment and its Profile}

Figure 9A:
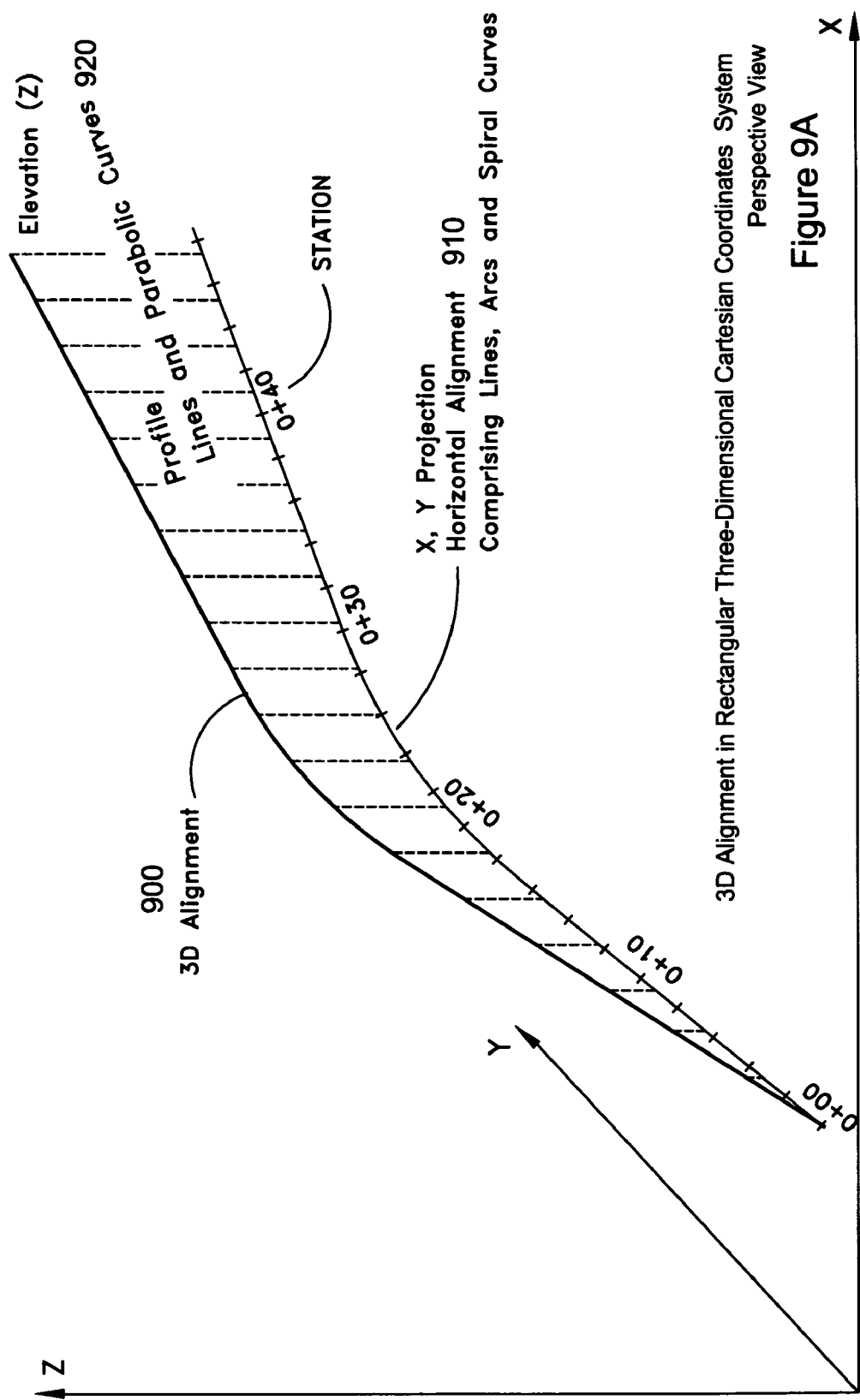

One skilled in the art would appreciate that the 3D alignments of linear objects and surface objects are defined by a horizontal alignment and a profile. FIG. 9A shows a 3D alignment 900 and its horizontal alignment 910 and profile 920 in the Cartesian rectangular three-dimensional coordinates system, while X, Y plane commonly corresponding to the earth surface plane and Z coordinate corresponding to the elevation in the civil engineering design.

The horizontal alignment 910 of 3D alignment, as shown in FIG. 9B, is 2D projection of the 3D alignment on the earth surface plane (X, Y plane), commonly comprising 2D lines, circular curves and spiral curves, with station 911 that is horizontal 2D distance from a point on the horizontal alignment to the beginning point of the horizontal alignment calculated along the horizontal alignment.

Figure 9C:
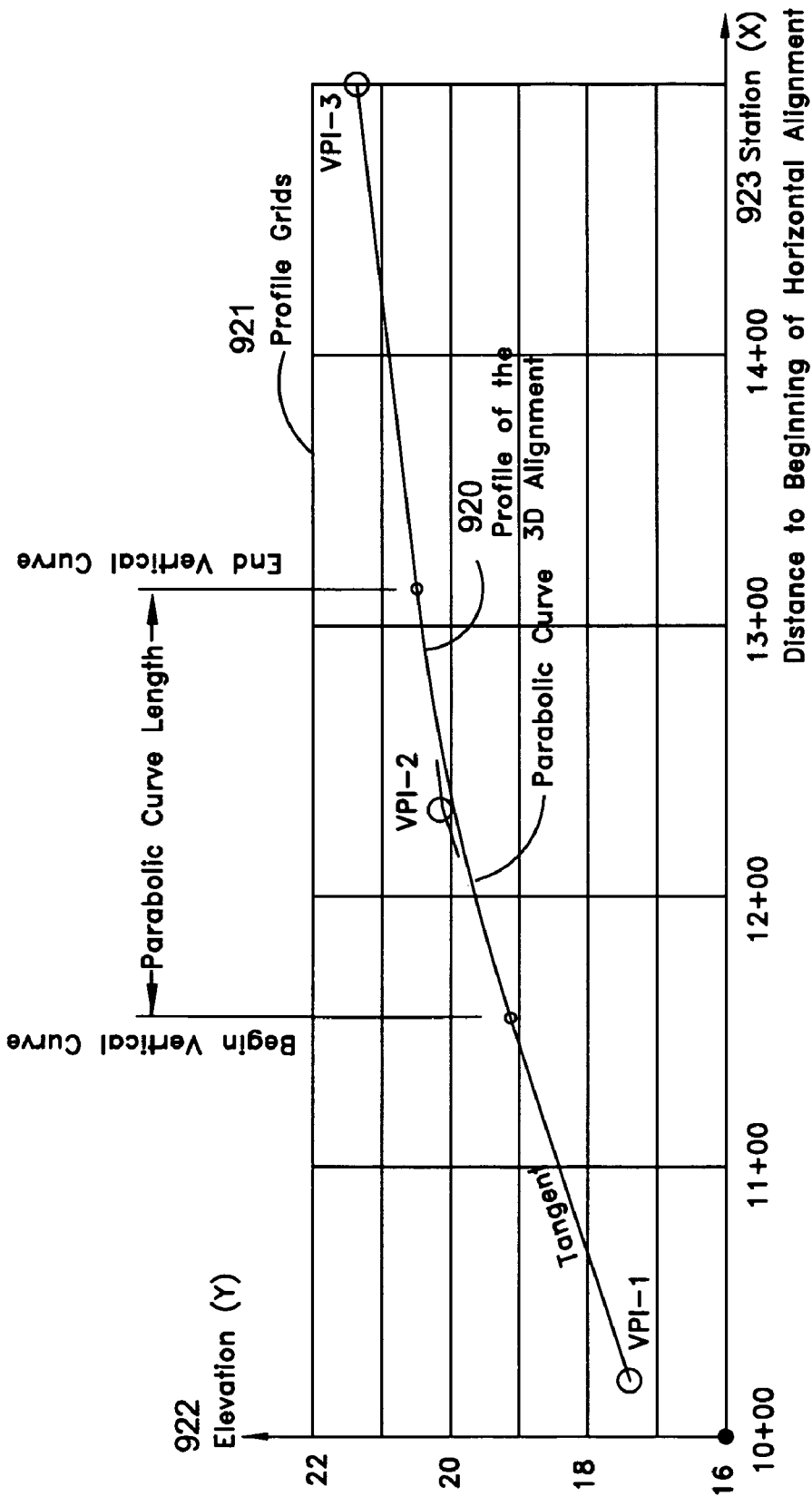

The profile 920 of 3D alignment, as shown in FIG. 9C, is the elevation (defined related to earth datum) variations of the 3D alignment along its horizontal alignment, defined by stations and elevations along the horizontal alignment of the 3D alignment. The profile commonly comprises lines and parabolic curves, shown within 2D profile grids 921, with X corresponding to the station 923 and Y corresponding to the elevation 922. In the civil engineering design, both horizontal alignment and profile must be continuous, and most of their adjacent line and curve entities are commonly tangent to each other.

One skilled in the art would appreciate that, in the civil engineering design, the profiles of the 3D alignments could be defined in two manners, using a chain of VPI data structures, or using a chain of CSV data structures and a source 3D alignment. In this document, the profile defined by VPI data structures is referenced as VPI profile, and the profile defined by CSV data structures is referenced as CSV profile For the VPI profile, FIG. 9D shows parabolic curve formulas to calculate the parabolic curves fitted between two intersecting tangents under the metric unit system, quoted from the Highway Design Manual (by California Department of Transportation), and these formulas might have different forms in other reference books, or for different unit systems. Referencing to FIG. 9D, one skilled in the art would appreciate that the VPI profile could be defined by a chain of VPI data structures. The VPI data structure 931 contains VPI station 936, VPI elevation 937 and the length 938 of the parabolic curve 935 that is fitted between the two adjacent tangents 932 and 933 intersecting at this VPI 930. The VPI data structures are placed at all turning points along the profile tangents and at beginning and end points of the profile, with the parabolic curve length at these VPI locations. The parabolic curve length of VPI data structure at the beginning and end points of the profile is treated as zero. If the adjacent line and parabolic curve are not tangent to each other, their intersection point is treated as a VPI with parabolic curve length to be zero. There is no VPI at intersection of two compound or reverse parabolic curves. One skilled in the art would appreciate that the VPI profile of 3D alignment could be defined by a chain of VPI data structures with some circumstance where the parabolic curve lengths are zero. One skilled in the art would appreciate that the VPI profile elevation formula 939 could be derived for a complete VPI profile using conventional geometric knowledge in mathematics.)

Figure 9E:
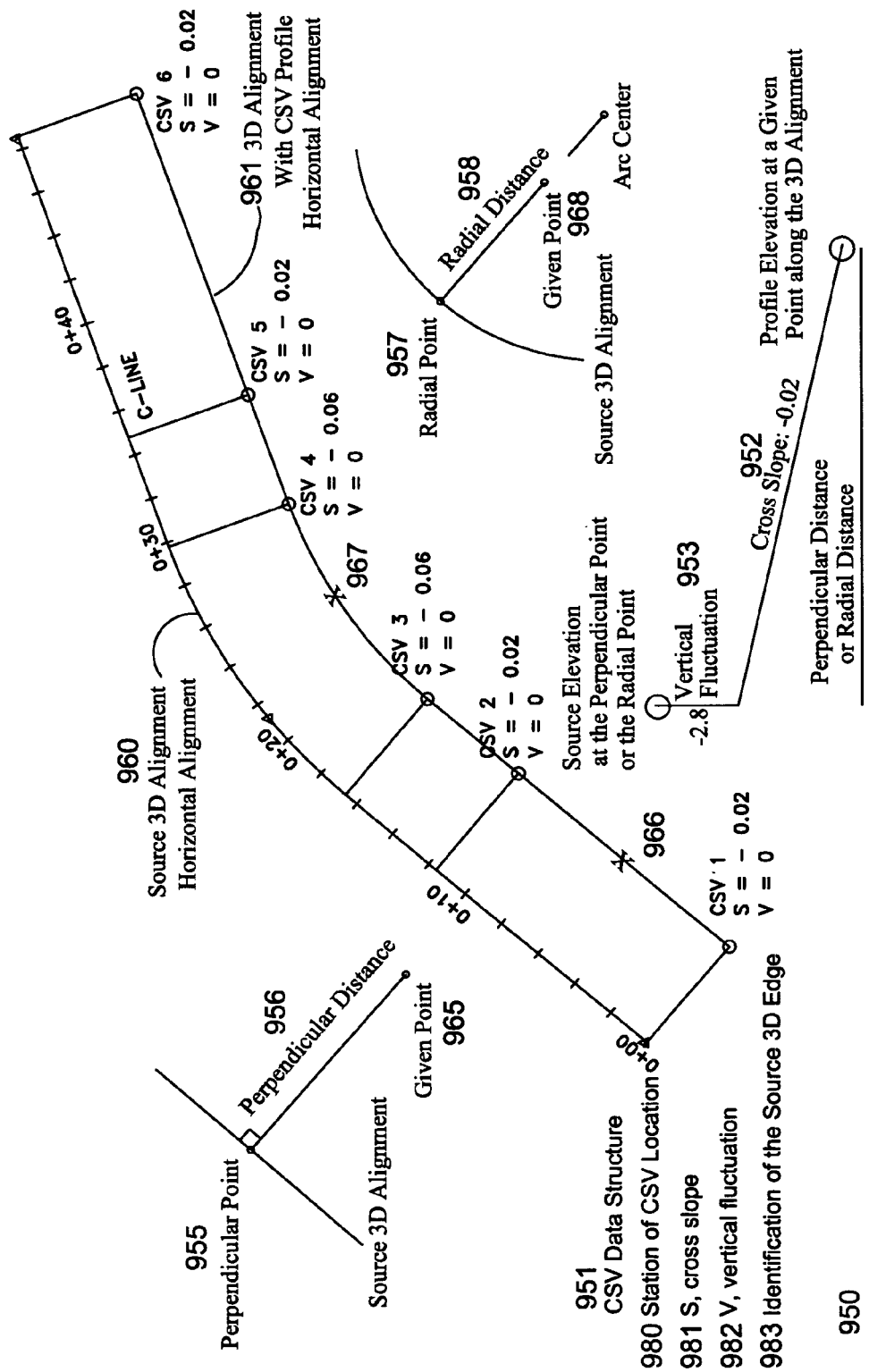

One skilled in the art would appreciate that the CSV profile could be defined by a chain of CSV data structures and a source 3D alignment. FIG. 9E and FIG. 9F illustrate a CSV profile is defined by a chain of CSV data structures and a source 3D alignment.

As shown in FIG. 9E, from the given point 965, draw a 2D perpendicular line to the tangent of the horizontal alignment of the source 3D alignment, the intersection point 955 is the perpendicular point of the given point on the horizontal alignment. The 2D distance between the given point and the perpendicular point is the perpendicular distance 956. From the given point 968, draw a 2D radial line from the arc center, passing this given point, to the arc of the horizontal alignment of the source 3D alignment, the intersection point 957 is the radial point of the given point on the horizontal alignment. The 2D distance between the given point and the radial point is the radial distance 958. (One skilled in the art would appreciate that the perpendicular point, perpendicular distance, radial point, and radial distance are all treated as 2D geometric calculations on the earth surface plane, and if any points, lines or curves are 3D entities, their 2D projections on the earth surface plane will be used to calculate the perpendicular point, perpendicular distance, radial point, and radial distance.)

As shown in FIG. 9E, the CSV data structure 951 comprises station 980, cross slope value 981, vertical fluctuation value 982, at the CSV location, and identification of the source 3D edge 983. The elevation at a given point along the 3D alignment 961 with CSV profile is determined by the CSV profile elevation formula 950 using the data of 1) the profile elevation of the source 3D alignment 960 at the perpendicular point or the radial point of the given point, 2) perpendicular distance or radial distance from the given point to the source 3D alignment, and 3) cross slope value 952 and vertical fluctuation value 953 at this point obtained from the linear interpolation of the two adjacent CSV data structures using the cross slope and vertical fluctuation interpolation formulas 977 and 978 as shown in FIG. 9F.

As shown in FIG. 9F, the CSV data structure of a given point 973 along a 3D alignment with CSV profile, is determined by linear interpolation of the CSV data structures at predecessor CSV location 975 and successor CSV location 976, using the linear interpolation formula 977 for cross slope and the linear interpolation formula 978 for vertical fluctuation.

In the present embodiment, VPI profile means are provided to calculate elevations of the VPI profile from the chain of VPI data structures. As shown in FIG. 9G, the VPI profile means comprise function steps of, 991 receiving the station of a given point and the chain of VPI data structures, 992 calculating the elevation at the given point using pertinent VPI profile elevation formulas, and 993 returning the elevation data. (One skilled in the art would appreciate that the VPI profile elevation formulas could be derived using conventional geometric knowledge in mathematics, similar to the formula 939 shown on FIG. 9D.)

In the present embodiment, the CSV profile means are provided to calculate elevations of the CSV profile from the chain of CSV data structures, and the geometric data of said source 3D alignment. As shown in FIG. 9H, the CSV profile means comprise function steps of, 996 receiving the station of a given point, 997 finding two adjacent CSV data structures and calculating the CSV data structure at this point using the linear interpolation formulas, 998 calculating the perpendicular point or radial point to the source 3D alignment and calculating the elevation at the perpendicular point or radial point of the source 3D alignment and calculating the elevation for the given point using pertinent CSV profile elevation formulas, and 999 returning the elevation data. (One skilled in the art would appreciate that the CSV profile elevation formulas could be derived using conventional geometric knowledge in mathematics, similar to the CSV profile elevation formula 950 shown on FIG. 9E.)

In the present embodiment, a 3D alignment is defined and represented by its horizontal alignment and a chain of VPI profile controller objects placed along its horizontal alignment, and supported by the VPI profile means. Each VPI profile controller object comprises a graphic symbol and a VPI data structure. The 3D alignment is represented by is horizontal alignment and the graphic symbols of VPI profile controller objects.

In the present embodiment, a 3D alignment is defined and represented by its horizontal alignment and a chain of CSV profile controller objects placed along its horizontal alignment, and supported by the CSV profile means. Each CSV profile controller object comprises a graphic symbol and a CSV data structure. The 3D alignment is represented by is horizontal alignment and the graphic symbols of CSV profile controller objects.

FIG. 9I illustrates that a segment of pavement is defined and represented by a surface object, and the primary 3D edge 985 of the surface object is defined and represented by its horizontal alignment and a chain of VPI profile controller objects 986, and the secondary 3D edge 987 of the surface object is defined and represented by its horizontal alignment and a chain of CSV profile controller objects 988, while the primary 3D edge is the control line of the roadway, and the secondary 3D edge is the edge of pavement with the source 3D alignment being the primary 3D edge 985. One skilled in the art would appreciate that surface elevations of the surface object for this segment of pavement is defined by the primary 3D edge and secondary 3D edge, and its relative parametric sections.

{Using Civil Engineering Objects}

A computer implemented method for using a civil engineering object to define and represent a three-dimensional civil engineering design component comprises:
a) setting positioning geometry data for defining three-dimensional geometry and spatial positioning of the civil engineering object in a Cartesian coordinates system, and
b) setting relative parametric model name data for specifying the name of the relative parametric model that applies to the civil engineering object, and
c) setting relative parametric perimeters data for specifying the values of the relative parametric perimeters, and
d) providing geometric calculation means for calculating spatial coordinates and three-dimensional geometric features of the civil engineering object from the positioning geometry data and relative parametric perimeters data of the civil engineering object according to the relative parametric model with the relative parametric model name,
e) setting graphic representation data for presenting the civil engineering object in a drawing with a collection of graphic entities and display styles, and
f) setting engineering attributes data for describing engineering characteristics of the civil engineering object, and g) setting object relationships data for specifying geometric and engineering relationships of the civil engineering object with other civil engineering objects, and h) setting object identification data for identifying the civil engineering object in an engineering system.

whereby the civil engineering object define and represent three-dimensional geometry and spatial positioning of a civil engineering design component through its positioning geometry data, its relative parametric perimeters data, and supported by its relative parametric model.

A computer implemented method for using a surface object to define and represent a three-dimensional civil engineering surface, comprises:

a) setting positioning geometry data for defining two three-dimensional alignments of primary three-dimensional edge and secondary three-dimensional edge, and b) providing mesh line generation means for calculating and generating mesh lines of a ruled surface from the two three-dimensional alignments with pre-determined mesh line spacing data, using the perpendicular method, or using the distributed method, and c) generating mesh lines of the ruled surface for the surface object from the two three-dimensional alignments using the mesh line generation means, and d) setting relative parametric model name data for specifying the name of the relative parametric model that applies to the surface object, and e) providing geometric calculation means for calculating spatial coordinates and three-dimensional geometric features of the surface object from the positioning geometry data and the relative parametric perimeters data of the surface object according to the relative parametric model with the relative parametric model name, and f) providing relative parametric section means for calculating elevations along the mesh line of the ruled surface using the geometric data of the mesh line, and the relative parametric perimeters data, according to the geometric relationships depicted in the predefined relative parametric section drawing, and g) providing linear interpolation means for calculating the elevation at a given point between two adjacent mesh lines of the ruled surface from the elevations at the two adjacent mesh lines, whereby the method defines three-dimensional geometry and special positioning of a civil engineering surface using the ruled surface with mesh lines and the relative parametric section drawing that defines section geometry along the mesh lines.

I claim:

1. A system implemented in a computer, comprising a processor and a memory, for defining and representing three-dimensional civil engineering design components, comprising civil engineering objects and a library of predefined relative parametric models, wherein types of said civil engineering objects comprise spot object, linear object and surface object, and wherein each civil engineering object comprises:

a) positioning geometry data for defining three-dimensional geometry and spatial positioning of said civil engineering object in a Cartesian coordinates system, wherein said positioning geometry data of said spot object is geometric definition data of a three-dimensional point, said positioning geometry data of said linear object is geometric definition data of a three-dimensional alignment, and said positioning geometry data of said surface object is geometric definition data of two three-dimensional alignments, and b) relative parametric model name data for specifying the name of said relative parametric model that applies to said civil engineering object, wherein said relative parametric model further comprises a relative parametric model drawing and relative parametric model means, and c) relative parametric perimeters data for specifying values of the relative parametric perimeters, and d) geometric calculation means for calculating three-dimensional geometric features and spatial coordinates of said civil engineering object from said positioning geometry data and said relative parametric perimeters data, according to said relative parametric model, whereby the civil engineering objects define and represent three-dimensional geometry and spatial positioning of the civil engineering design components through their positioning geometry data and relative parametric perimeters data, supported by a library of predefined relative parametric models.

2. The system of claim 1, wherein said civil engineering object further comprises:

a) graphic representation data for representing said civil engineering object in a drawing with a collection of graphic entities and display styles, and b) engineering attributes data for specifying descriptive engineering characteristics of said civil engineering object, and c) object relationships data for specifying geometric and engineering relationships of said civil engineering object with other civil engineering objects, and d) object identification data for identifying said civil engineering object in an engineering system.

3. The system of claim 1, wherein each type of said civil engineering objects are further classified as predefined categories based on similarities in their outline geometry and engineering characteristic.

4. The system of claim 1, wherein said relative parametric model is established per each civil engineering object category, and said relative parametric model drawing is predefined for depicting and delineating elements of object positioning geometry, reference points of the object positioning geometry on section view, elements of object three-dimensional outline geometry, elements of object section outline geometry, and designations of the relative parametric perimeters, and said relative parametric model means is pre-programmed computer subroutine for calculating geometric features of said civil engineering object according to geometric relationships depicted in said relative parametric model drawing.

5. The system of claim 1, wherein said relative parametric models are pre-established for all civil engineering object categories, and wherein said relative parametric models are identified and referenced by their names consisting of strings, and wherein said relative parametric models are stored in computers for reuse.

6. The system of claim 1, wherein said relative parametric model drawing of said surface object further comprises a ruled surface drawing, and a relative parametric section drawing, and wherein mesh lines of said ruled surface are generated from said two three-dimensional alignments of said surface object, and wherein said relative parametric section drawing depicts and delineates section geometry along said mesh lines, including reference points of said two three-dimensional alignments on section view, elements of section outline geometry, and designations of said relative parametric perimeters.

7. The system of claim 6, wherein some of said relative parametric perimeters designated in said relative parametric section drawing are variables and their values are determined by geometric definition data of said mesh line and values of other relative parametric perimeters that are treated as constants.

8. The system of claim 6, wherein said surface object further comprise mesh line generation means for calculating and generating said mesh lines of said ruled surface from said two three-dimensional alignments with pre-determined mesh line spacing data, using one of the perpendicular method and the distributed method.

9. The system of claim 6, wherein said relative parametric model means of said surface object further comprises relative parametric section means for calculating elevations along a mesh line of said ruled surface, and linear interpolation means for calculating elevation at a given point between two adjacent mesh lines of said ruled surface.

10. The system of claim 1, wherein the types of said civil engineering objects further comprise triangulated-irregular-networks object for defining and representing natural terrain surfaces and grading design surfaces.

11. The system of claim 1, wherein said three-dimensional alignment of said positioning geometry data is defined and represented by a horizontal alignment and a profile.

12. The system of claim 11, wherein said profile of said three-dimensional alignment is defined and represented by a chain of vertical point of intersection (VPI) profile controller objects placed along said horizontal alignment, and supported by VPI profile means.

13. The system of claim 12, wherein each VPI profile controller object further comprises a graphic symbol and a VPI data structure, and wherein said VPI data structure further comprises station value, elevation value, and parabolic curve length value, at location of said VPI profile controller object along said horizontal alignment.

14. The system of claim 12, wherein said VPI profile means calculate elevations of said profile from VPI data structure values stored in the chain of said VPI profile controller objects placed along said horizontal alignment.

15. The system of claim 11, wherein said profile of said three-dimensional alignment is defined and represented by a chain of cross slope and vertical fluctuation (CSV) profile controller objects placed along said horizontal alignment, and supported by CSV profile means.

16. The system of claim 15, wherein each CSV profile controller object further comprises a graphic symbol and a CSV data structure, and wherein said CSV data structure further comprises identification data of a source three-dimensional alignment, and station value, cross slope value and vertical fluctuation value at location of said CSV profile controller object along said horizontal alignment.

17. The system of claim 15, wherein said CSV profile means calculate elevations of said profile from CSV data structure values stored in the chain of said CSV profile controller objects, and geometric data of said source three-dimensional alignment.

* * * * *